(12) United States Patent
Satake et al.

(10) Patent No.: US 10,243,140 B2
(45) Date of Patent: Mar. 26, 2019

(54) MANUFACTURING METHOD OF MAGNETORESISTIVE ELEMENT AND VACUUM PROCESSING APPARATUS

(71) Applicant: Hitachi High-Technologies Corporation, Tokyo (JP)

(72) Inventors: Makoto Satake, Tokyo (JP); Masaki Yamada, Tokyo (JP); Kenetsu Yokogawa, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 241 days.

(21) Appl. No.: 15/251,595

(22) Filed: Aug. 30, 2016

(65) Prior Publication Data

US 2017/0194560 A1 Jul. 6, 2017

(30) Foreign Application Priority Data

Jan. 4, 2016 (JP) .................... 2016-000030

(51) Int. Cl.
| | |
|---|---|
| *H01L 43/12* | (2006.01) |
| *H01J 37/32* | (2006.01) |
| *H01L 27/22* | (2006.01) |
| *H01L 43/02* | (2006.01) |
| *H01L 43/08* | (2006.01) |

(52) U.S. Cl.
CPC ........ *H01L 43/12* (2013.01); *H01J 37/32816* (2013.01); *H01L 27/228* (2013.01); *H01L 43/02* (2013.01); *H01L 43/08* (2013.01)

(58) Field of Classification Search
CPC ..................................................... H01L 43/12
See application file for complete search history.

(56) References Cited

FOREIGN PATENT DOCUMENTS

| JP | 08-253881 A | 10/1996 |
|---|---|---|
| JP | 2005-042143 A | 2/2005 |

(Continued)

OTHER PUBLICATIONS

J. H. Heong et al.; "Novel oxygen showering process (OSP) for extreme damage suppression of sub-20 nm high density p-MTJ array without IBE treatment" 2015 Symposium on VLSI Technology Digest of Technical Papers.

(Continued)

*Primary Examiner* — Marvin Payen
(74) *Attorney, Agent, or Firm* — Mattingly & Malur, PC

(57) ABSTRACT

The present invention is a manufacturing method for manufacturing a magnetoresistive element, including a first step for oxidizing or reducing a magnetic film constituting the magnetoresistive element and a metal oxidation film constituting the magnetoresistive element, and a second step performed after the first step, wherein in the second step, in a case where the magnetic film constituting the magnetoresistive element and the metal oxidation film constituting the magnetoresistive element are oxidized, the oxidized magnetic film constituting the magnetoresistive element or the oxidized metal oxidation film constituting the magnetoresistive element is selectively reduced, and in a case where the magnetic film constituting the magnetoresistive element and the metal oxidation film constituting the magnetoresistive element are reduced, the reduced magnetic film constituting the magnetoresistive element or the reduced metal oxidation film constituting the magnetoresistive element is selectively oxidized.

5 Claims, 15 Drawing Sheets

(56) References Cited

FOREIGN PATENT DOCUMENTS

| JP | 2009-206472 A | 9/2009 |
|---|---|---|
| JP | 2009-302550 A | 12/2009 |

OTHER PUBLICATIONS

Keizo Kinoshita et al., "Damage Recovery by Reductive Chemistry after Methanol-Based Plasma Etch to Fabricate Magnetic Tunnel Junctions Damage", Japanaese Journal of Applied Physical 51 (2012) 08HA01.

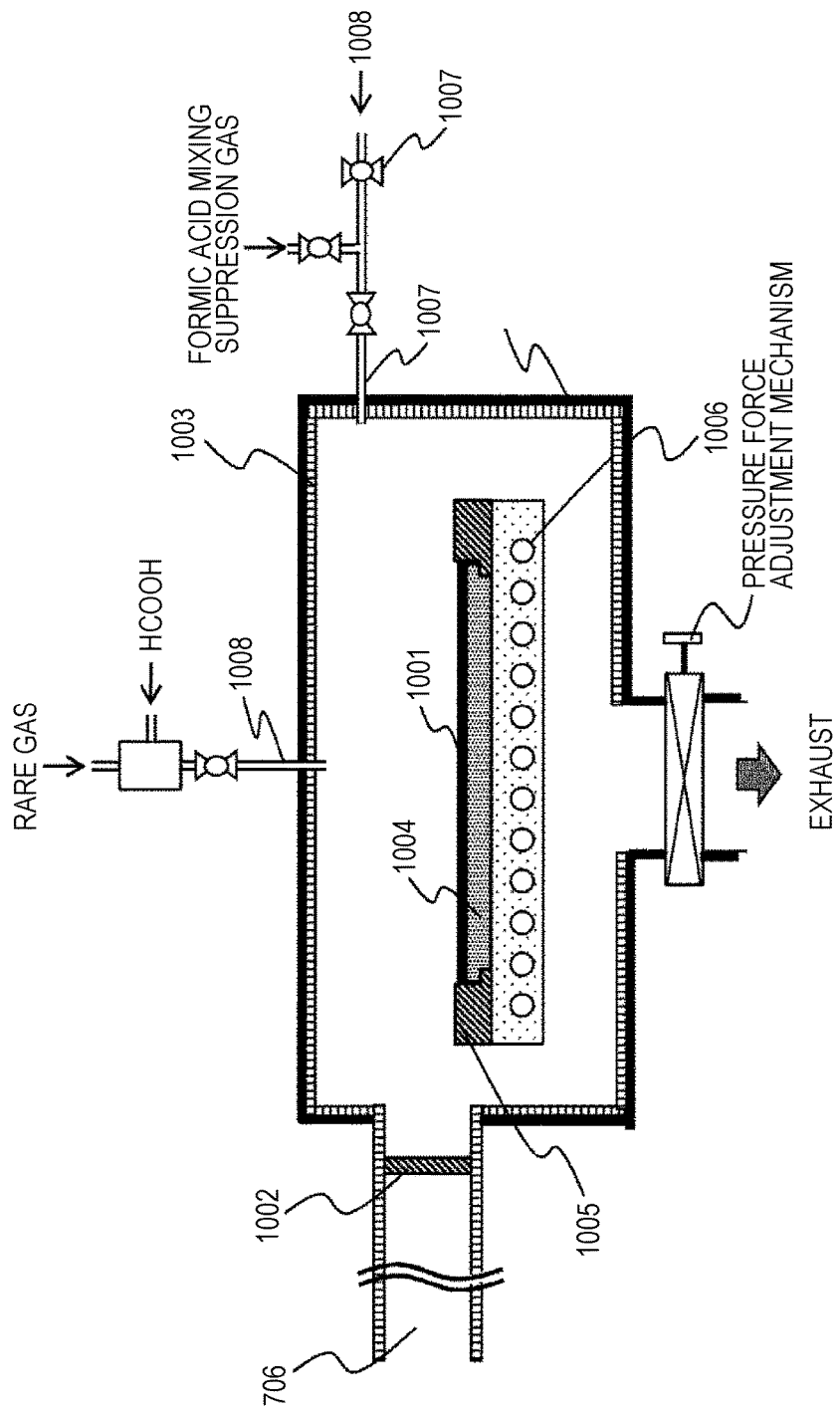

STEP 1

STEP 1  STEP 2  STEP 3

FIG. 12

| | REACTION FORMULA | ΔG (eV) | |
|---|---|---|---|
| | | 0 °C | 500 °C |
| OXIDIZING REACTION | $2Fe + 1.5O_2 = Fe_2O_3$ | −7.7 | −6.4 |
| | $3Co + 2O_2 = Co_3O_4$ | −8.3 | −6.3 |
| | $2Ni + O_2 = 2NiO$ | −4.4 | −3.5 |
| | $2Mg + O_2 = 2MgO$ | −11.9 | −10.7 |
| REDUCING REACTION | $Fe_2O_3 + 3HCOOH = 2Fe + 3H_2O + 3CO_2$ | −1.0 | −1.8 |
| | $Co_3O_4 + 4HCOOH = 3Co + 4H_2O + 4CO_2$ | −3.4 | −4.5 |
| | $NiO + HCOOH = Ni + H_2O + CO_2$ | −0.7 | −0.9 |
| | $MgO + HCOOH = Mg + H_2O + CO_2$ | +3.0 | +2.8 |

FIG. 13

| <PRODUCTS INCLUDING Mg> MgO, MgCO$_3$, Mg(OH)$_2$, MgO$_2$, MgOH, MgH$_2$, MgH, Mg, Mg$_2$, MgC$_2$, Mg$_2$C$_3$, Mg(COOH)$_2$ | <PRODUCTS NOT INCLUDING Mg> O, O$_2$, O$_3$, CO, CO$_2$, C$_2$O, C$_3$O$_2$, H$_2$O, H$_2$O$_2$, HCO, HO$_2$, COOH, HCOOH, OH, H, H$_2$, CH, CH$_2$, CH$_3$, CH$_4$, C$_2$H, C$_2$H$_2$, C$_2$H$_3$, C$_2$H$_4$, C$_2$H$_5$, C$_2$H$_6$, C, C$_2$, C$_3$, C$_4$, C$_5$ |
|---|---|

FIG. 14

| ⟨PRODUCTS INCLUDING Mg⟩ |
| --- |
| $MgO$, $Mg(OH)_2$, $MgO_2$, $MgOH$, $MgH_2$, $MgH$, $Mg$, $Mg_2$ |
| ⟨PRODUCTS NOT INCLUDING Mg⟩ |
| $O$, $O_2$, $O_3$, $H_2O$, $H_2O_2$, $HO_2$, $OH$, $H$, $H_2$ |

FIG. 15

| REACTION FORMULA | |
|---|---|
| $Fe_2O_3$ + REDUCING GAS = 2Fe + REACTION PRODUCT | $\Delta G < 0$ |
| $Co_3O_4$ + REDUCING GAS = 3Co + REACTION PRODUCT | $\Delta G < 0$ |
| NiO + REDUCING GAS = Ni + REACTION PRODUCT | $\Delta G < 0$ |
| MgO + REDUCING GAS = Mg + REACTION PRODUCT | $\Delta G > 0$ |

MANUFACTURING METHOD OF MAGNETORESISTIVE ELEMENT AND VACUUM PROCESSING APPARATUS

BACKGROUND OF THE INVENTION

1. Field of the Invention

The present invention relates to a manufacturing method of a magnetoresistive element and a vacuum processing apparatus using the manufacturing method.

2. Description of the Related Art

With the increase in the amount of information in recent years, electronic devices are desired to consume less energy, and memories are desired to operate at a high speed and desired to be nonvolatile. Currently used memories include a DRAM (Dynamic Random Access Memory, hereinafter referred to as a DRAM), a flash memory, and the like that use accumulation of electrical charges. The DRAM is used as a main memory of a computer, and is a volatile memory that loses memory when the power supply is cut off.

It is necessary to perform rewriting with a regular interval of time in order to hold data during operation, and this increases the consumed electric power. On the other hand, the flash memory is a non-volatile memory, but the writing time of information is slow, i.e., in the order of microseconds. It has been expected to apply a magnetoresistive memory (Magnetic Random Access Memory: MRAM) as a non-volatile memory consuming low electric power and operating at a high speed without having such disadvantages explained above.

FIGS. 1A and 1B illustrate a basic structure of a magnetoresistive memory. The magnetoresistive memory includes a magnetoresistive element 103 installed between a bit line 101 and a word line 102, and a transistor 104 for selecting each resistance element. The magnetoresistive element 103 has such a structure in which a magnesium oxide (MgO) 107 is sandwiched between a free layer 105, i.e., a magnetic film in which a direction of magnetization can be reversed by an external magnetic field or spin injection, and a fixed layer 106 which is a magnetic film in which a direction of magnetization is kept fixed.

The magnetoresistive element 103 is such that, as illustrated in FIG. 1A, when the directions of the magnetizations (arrow in the drawing) of the free layer 105 and the fixed layer 106 are in parallel to each other, the resistance of the magnetoresistive element 103 becomes low, and as illustrated in FIG. 1B, when the directions of the magnetizations of the free layer 105 and the fixed layer 106 are in antiparallel to each other, the resistance of the magnetoresistive element 103 becomes high. A memory in which the resistance difference of this magnetoresistive element 103 is associated with I/O signals is a magnetoresistive memory, and the manufacturing of the magnetoresistive element, which is the core of the magnetoresistive memory, is important.

In FIGS. 1A and 1B, the directions of the magnetizations of the free layer 105 and the fixed layer 106 are in a vertical direction with respect to the film surface, but they may also be in a horizontal direction with respect to the film surface. In FIGS. 1A and 1B, the free layer 105 is formed at the upper side of the magnesium oxide (MgO), and the fixed layer 106 is formed at the lower side of the magnesium oxide (MgO), but the positions of the free layer 105 and the fixed layer 106 may be reversed. More specifically, the fixed layer 106 may be formed at the upper side of the magnesium oxide (MgO), and the free layer 105 may be formed at the lower side of the magnesium oxide (MgO). Not only the magnetoresistive memory but also a magnetic head, a magnetic sensor and the like using this magnetoresistive element have been developed rapidly.

The manufacturing of the magnetoresistive element requires a technique of micromachining with dry etching for processing a magnetic film including chemical elements such as Fe, Co, Ni, and the like used in the free layer and the fixed layer and a barrier layer made of magnesium oxide (MgO). Two types of methods as illustrated in FIGS. 11A and 11B have been considered as a processing method of a magnetoresistive element using plasma etching. The first method is, as illustrated in step 1 in FIG. 11A, a method for collectively processing a free layer 1102, a magnesium oxide (MgO) 1103, and a fixed layer 1104 formed on an Si wafer 1101 by using a mask 1105.

The second method is a method in which, as illustrated in FIG. 11B, etching is interrupted after a free layer 1102 is processed by using a mask 1105 (step 1), and after the protection film 1106 is thereafter formed (step 2), the magnesium oxide (MgO) 1103 and the fixed layer 1104 are processed (step 3). In FIGS. 11A and 11B, the free layer 1102 is formed at the upper side of the magnesium oxide (MgO) 1103, and the fixed layer 1104 is formed at the lower side of the magnesium oxide (MgO) 1103, but the positions of the free layer 1102 and the fixed layer 1104 may be reversed.

In step 3 in FIG. 11B, the magnesium oxide (MgO) 1103 and the fixed layer 1104 are processed by using the protection film 1106, but in a case where the protection film cannot obtain a sufficient level of etching resistivity against the magnetic film, a mask may be formed on the protection film 1106 before step 3 is performed, and the magnesium oxide (MgO) 1103 and the fixed layer 1104 may be processed by using the mask. In the method as illustrated in FIGS. 11A and 11B, in step 1 of FIG. 11A and step 1 and step 3 of FIG. 11B, it is necessary to have micromachining technique for processing the magnetic film and the magnesium oxide (MgO) by using plasma etching, and two methods including a method using ion beam etching and a method using plasma etching have been considered as this method.

In the ion beam etching, a processing gas is introduced to a depressurized ion source, the gas is into plasma by applying a radio frequency electric power to a processing chamber via a flat-plate antenna, a coil-shaped antenna, and the like, and the ions generated therefrom are accelerated and drawn from the ion source into the processing chamber with the voltage applied to several grid electrodes, and the ion beam etching advances as the drawn ions are emitted onto the substrate disposed in the processing chamber.

As the ion source, there are various methods such as magneto-active field microwave type, Inductively Coupled Plasma (Inductively Coupled Plasma: ICP) type, and the like, which are different in the method for generating plasma. In order to make it less likely for the wafer to be charged to a positive polarity with the emitted ions, a neutralizing gun for emitting electrons may be installed in a processing chamber. In this method, with the radio frequency electric power, the amount of emission of ion can be controlled so that the energy of the ion is controlled in accordance with a voltage applied to the grid electrodes.

The wafer stage in the processing chamber has a rotation mechanism and an inclination mechanism, and the uniformity of the beam in the circumferential direction can be improved by rotating the wafer at a constant speed during processing, and the angle of the ion emitted onto the wafer can be controlled with the inclination mechanism. In this method, rare gases such He, Ne, Ar, Kr, Xe are generally used as the gas introduced in to the ion source and made into plasma, but it may be possible to mix reactive gases such as hydrogen, nitrogen, oxygen, and the like.

On the other hand, in the plasma etching, the processing gas is introduced into the depressurized processing chamber, and the gas is made into plasma when the source power supply provides the radio frequency electric power (hereinafter referred to as a source electric power) into the processing chamber via the flat-plate antenna, the coil-shaped antenna, and the like, so that the plasma etching advances when ions and radicals generated therefrom are directly emitted onto the substrate. As the plasma source, there are various methods such as magneto-active field microwave type, Inductively Coupled Plasma (ICP) type, Capacitively Coupled Plasma (CCP) type, and the like which are different in the method for generating plasma.

In order to actively draw the ions in the plasma into the wafer, a radio frequency electric power (which may be hereinafter referred to as a bias electric power) may also be applied to a stage on which the wafer is installed. As the method of processing the magnetoresistive element using the plasma etching, etching methods using plasma including oxygen atoms and hydrogen atoms have been considered, e.g., a method for making a mixed gas of CO and $NH_3$ into plasma disclosed in Japanese Patent Laid-Open No. H08-253881 and a method for making $CH_3OH$ gas into plasma disclosed in Japanese Patent Laid-Open No. 2005-042143 have been considered.

According to the magnetic film processing method based on the ion beam etching and the plasma etching explained above, in a case where an emitted ion collides with the magnesium oxide (MgO), oxygen of which mass is lighter than magnesium is selectively removed from magnesium oxide (MgO), and magnesium oxide (MgO) is caused to be in a low oxidation state (reduced), so that the electrical characteristics of the magnetoresistive element are deteriorated. There is a problem in that, in the plasma etching, reduction of magnesium oxide (MgO) which is the barrier layer is promoted by the hydrogen ions and the hydrogen radicals generated in the plasma, and the electrical characteristics of the magnetoresistive element are deteriorated.

On the other hand, in a case where plasma generated using a gas including oxygen chemical elements is used in ion beam etching and plasma etching, the magnetic film used in the fixed layer and the free layer is oxidized by the oxygen radicals and the oxygen ions used in the plasma, so that the electrical characteristics of the magnetoresistive element are deteriorated. Therefore, it is necessary to achieve a process that can realize both of suppressing reduction of magnesium oxide (MgO) and suppressing oxidation of the magnetic film.

As the method for recovering a damage caused by the magnesium oxide (MgO), "Novel oxygen showering process (OSP) for extreme damage suppression of sub-20 nm high density p-MTJ array without IBE treatment" (J. H. Jeong and T. Endoh, Symposium on VLSI Technology Digest of Technical Papers (2015)) reports a recovery method for etching a magnetic film by using plasma including hydrogen chemical elements and thereafter emitting ozone gas to the magnetoresistive element. As the method for recovering the damage caused by oxidation of the magnetic film, "Damage recovery by reductive chemistry after methanol-based plasma etch to fabricate magnetic tunnel junctions damage" (K. Kinoshita et al., Japanese Journal of Applied Physics 51 (2012)) reports a method for processing the magnetic film with an oxygen gas and a mixed gas of Ar and methanol and thereafter emitting plasma generated by $He/H_2$ gas onto a magnetoresistive element, thus recovering a damage of the magnetic film.

Japanese Patent Laid-Open No. 2009-302550 discloses, in order to etch a magnetic film with plasma including hydrogen atoms and oxygen atoms and thereafter remove a damaged layer formed during etching of a magnetic film, a method for performing reduction processing in a radical processing chamber using plasma generated with reducing gas such as hydrogen and ammonia and thereafter forming a protection film and a method for performing etching of the magnetic film, reduction processing, and formation of the protection film in a multi-chamber process in vacuum.

As the reduction of oxidized metal materials, Japanese Patent Laid-Open No. 2009-206472 discloses a method for oxidizing a metal material such as Cu by using plasma of oxygen gas after predetermined etching, then putting a wafer in atmosphere to clean the wafer with wet cleaning, thereafter performing reduction processing using a formic acid gas and the like in order to remove the plasma of the oxygen gas and metal oxides formed during conveyance in the atmosphere, and thereafter forming a barrier film according to a chemical vapor deposition (CVD) method using vapors of organic metal compounds, and a method for performing reduction processing using the formic acid gas and the like and a CVD method using vapors of organic metal compounds which are performed in a multi-chamber process in vacuum.

SUMMARY OF THE INVENTION

However, in the recovery method using the ozone gas disclosed in "Novel oxygen showering process (OSP) for extreme damage suppression of sub-20 nm high density p-MTJ array without IBE treatment" (J. H. Jeong and T. Endoh, Symposium on VLSI Technology Digest of Technical Papers (2015)), when the amount of emission of the ozone gas is too high, not only the reduced magnesium oxide (MgO) but also the magnetic film used in the fixed layer and the free layer are oxidized, and the electrical characteristics of the magnetoresistive element are deteriorated. Therefore, it is necessary to control the amount of emission of the ozone gas at an appropriate value. In the recovery method using the hydrogen-including plasma disclosed in "Damage recovery by reductive chemistry after methanol-based plasma etch to fabricate magnetic tunnel junctions damage" (K. Kinoshita et al., Japanese Journal of Applied Physics 51 (2012)) and Japanese Patent Laid-Open No. 2009-302550, when the amount of emission of the hydrogen-including plasma is too high, not only the oxidized magnetic film but also the magnesium oxide (MgO) are reduced, and the electrical characteristics of the magnetoresistive element are deteriorated.

Therefore, it is necessary to control the amount of emission of the hydrogen-including plasma at an appropriate value. The optimum value of the recovery method using the ozone gas and the recovery method using the hydrogen-including plasma greatly depends on a condition for etching the magnetoresistive element before the recovery method is performed. More specifically, in a case where the ions emitted during etching of the magnetic film are emitted to the magnesium oxide (MgO) with a high level of energy, or in a case where the amounts of the hydrogen ions and the hydrogen radicals included in the plasma generated in order to etch the magnetic film are excessive, the magnesium oxide (MgO) is reduced, and in a case where the amounts of the oxygen ions and the oxygen radicals included in the plasma generated in order to etch the magnetic film are excessive, the magnetic film is oxidized.

Depending on the etching condition, both of the reduction of the magnesium oxide (MgO) and the oxidation of the magnetic film may occur. Therefore, it is necessary to perform the recovery method under an optimum condition suitable for the reduction state of the magnesium oxide (MgO) and the oxidation state of the magnetic film caused by the etching. However, the plasma generated by the ion source of the ion beam etching apparatus and the plasma generated in the processing chamber of the plasma etching apparatus have a spatial density distribution, and it is difficult to emit ions and radicals to the entire surface of the wafer with a uniform quantity.

Therefore, it is difficult to uniformly control the reduction state of the magnesium oxide (MgO) and the oxidation state of the magnetic film on the entire surface of the wafer, and it is difficult to establish a process condition that achieve not only suppression of the reduction damage of the magnesium oxide (MgO) but also suppression of the oxidation damage of the magnetic film in all of the elements formed on the entire surface of the wafer. In addition, in a case where the method disclosed in Japanese Patent Laid-Open No. 2009-206472 is used, the reduction damage of the magnesium oxide (MgO) can be recovered in the oxidation processing after the etching, but since the magnesium oxide (MgO) has deliquescent property, the magnesium oxide (MgO) is deteriorated due to a moisture content used in wet processing performed subsequently and a moisture content included in the atmosphere during the conveyance in the atmosphere, so that the characteristics of the magnetic film are deteriorated.

In order to solve the above problems, it is necessary to achieve a recovery method and an apparatus for achieving the recovery method therefor achieving not only the suppression of the oxidation damage of the magnetic film and the suppression of the reduction damage of the magnesium oxide (MgO), and having controllability that suppresses the deterioration of the magnesium oxide (MgO) due to the moisture content.

The present invention provides a manufacturing method of a magnetoresistive element and a vacuum processing apparatus for manufacturing the magnetoresistive element achieving not only oxidation suppression of a magnetic film but also reduction suppression of a magnesium oxide (MgO) in order to recover reduction damage of the magnesium oxide (MgO) and oxidation damage of the magnetic film which have occurred during dry etching of the magnetoresistive element.

According to the present invention, there is provided a manufacturing method for manufacturing a magnetoresistive element including a first magnetic film, a metal oxidation film disposed at an upper side of the first magnetic film, and a second magnetic film disposed at an upper side of the metal oxidation film, including: a first step for oxidizing or reducing a magnetic film constituting the magnetoresistive element and a metal oxidation film constituting the magnetoresistive element; and a second step performed after the first step, wherein in the second step, in a case where the magnetic film constituting the magnetoresistive element and the metal oxidation film constituting the magnetoresistive element are oxidized, the oxidized magnetic film constituting the magnetoresistive element or the oxidized metal oxidation film constituting the magnetoresistive element is selectively reduced, and in a case where the magnetic film constituting the magnetoresistive element and the metal oxidation film constituting the magnetoresistive element are reduced, the reduced magnetic film constituting the magne-
toresistive element or the reduced metal oxidation film constituting the magnetoresistive element is selectively oxidized.

Furthermore, according to the present invention, there is provided a vacuum processing apparatus for manufacturing, in a vacuum state, a magnetoresistive element including a first magnetic film, a metal oxidation film disposed at an upper side of the first magnetic film, and a second magnetic film disposed at an upper side of the metal oxidation film, including: a first processing chamber for oxidizing or reducing the magnetic film constituting the magnetoresistive element and the metal oxidation film constituting the magnetoresistive element; and a second processing chamber, wherein after the processing of the first processing chamber, in a case where the magnetic film constituting the magnetoresistive element and the metal oxidation film constituting the magnetoresistive element are oxidized, the oxidized magnetic film constituting the magnetoresistive element or the oxidized metal oxidation film constituting the magnetoresistive element is selectively reduced, and in a case where the magnetic film constituting the magnetoresistive element and the metal oxidation film constituting the magnetoresistive element are reduced, the reduced magnetic film constituting the magnetoresistive element or the reduced metal oxidation film constituting the magnetoresistive element is selectively oxidized, wherein the first processing chamber and the second processing chamber are processing chambers in which processing is performed in a vacuum state.

In addition, according to the present invention, there is provided a vacuum processing apparatus for manufacturing, in a vacuum state, a magnetoresistive element including a first magnetic film, a metal oxidation film disposed at an upper side of the first magnetic film, and a second magnetic film disposed at an upper side of the metal oxidation film, the vacuum processing apparatus including a processing chamber that performs: first processing oxidizing or reducing a magnetic film constituting the magnetoresistive element and a metal oxidation film constituting the magnetoresistive element; and second processing performed after the first processing, wherein in the second step, in a case where the magnetic film constituting the magnetoresistive element and the metal oxidation film constituting the magnetoresistive element are oxidized, the oxidized magnetic film constituting the magnetoresistive element or the oxidized metal oxidation film constituting the magnetoresistive element is selectively reduced, and in a case where the magnetic film constituting the magnetoresistive element and the metal oxidation film constituting the magnetoresistive element are reduced, the reduced magnetic film constituting the magnetoresistive element or the reduced metal oxidation film constituting the magnetoresistive element is selectively oxidized, wherein the processing chamber is a processing chamber in which processing is performed in a vacuum state.

According to the present invention, not only the oxidation suppression of the magnetic film but also the reduction suppression of the magnesium oxide (MgO) can be achieved.

Figure 3A:
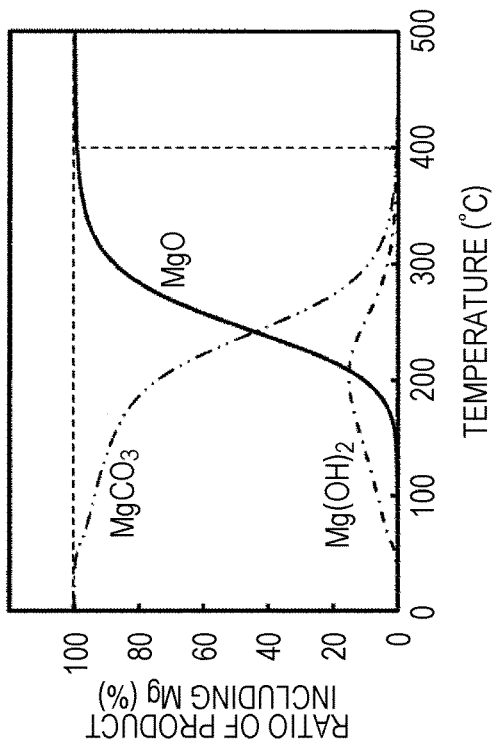
FIGS. 3A and 3B are figures illustrating a reaction calculation result of formic acid and magnesium oxide (MgO)
Figure 3B:
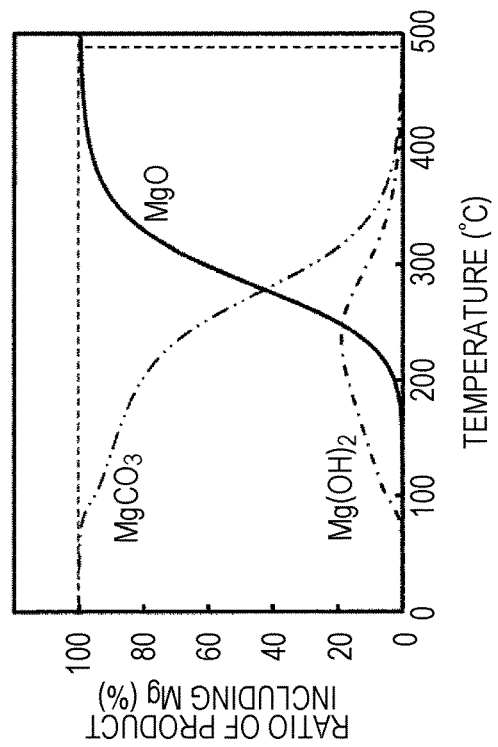
Figure 4:
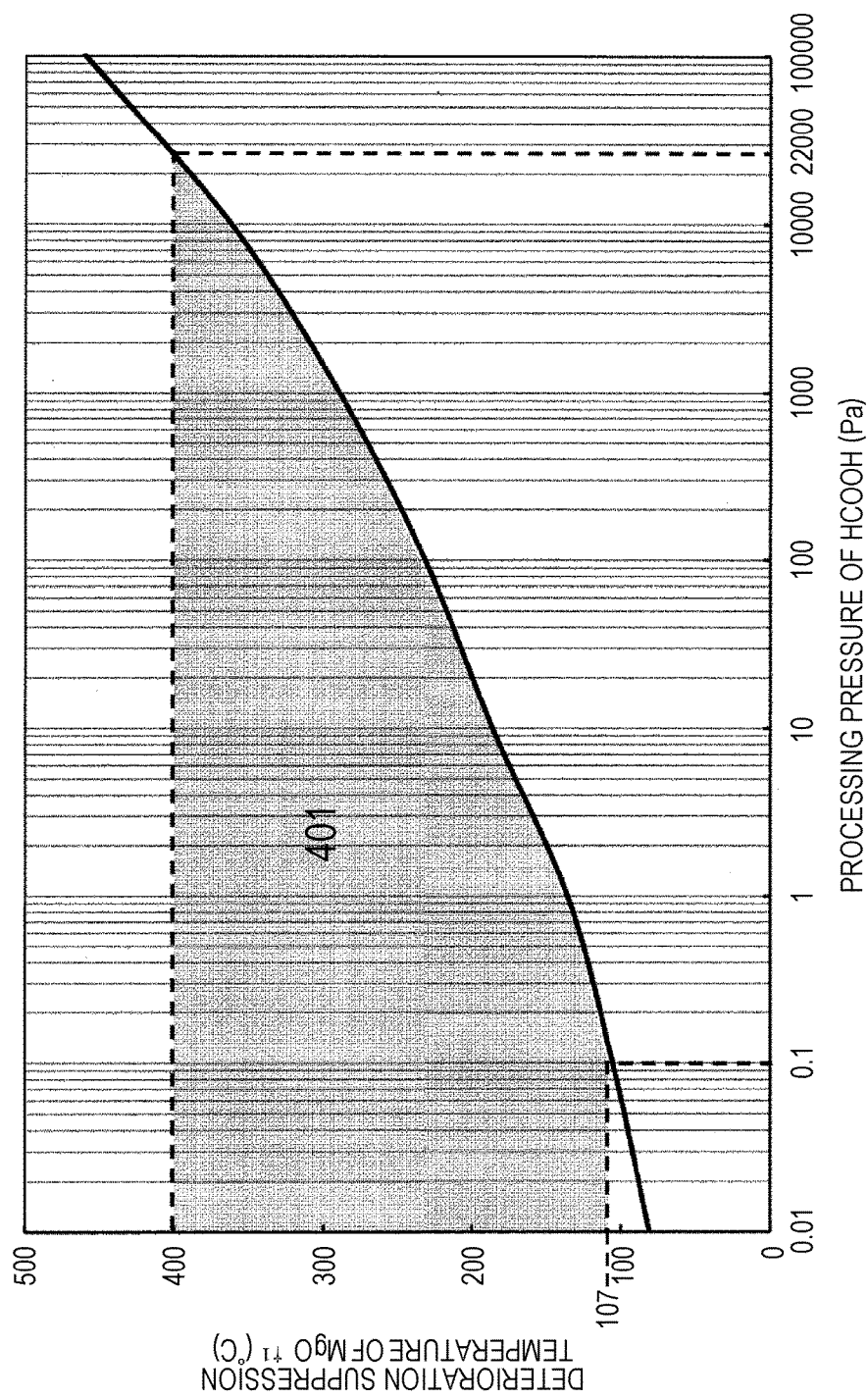
Figure 5A:
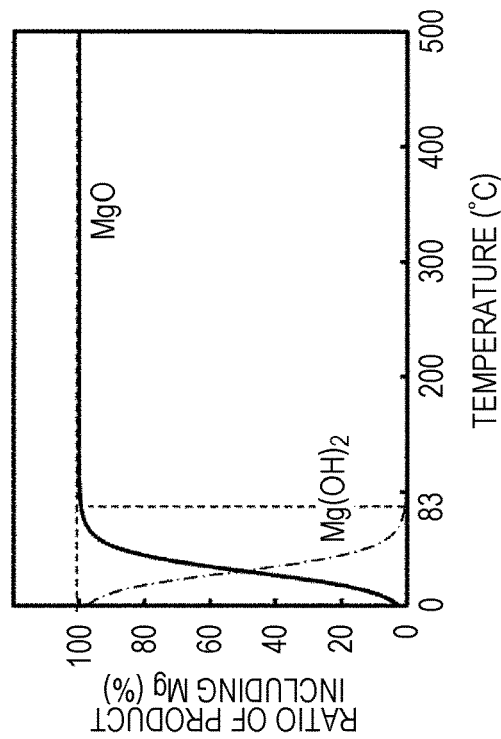
Figure 5B:
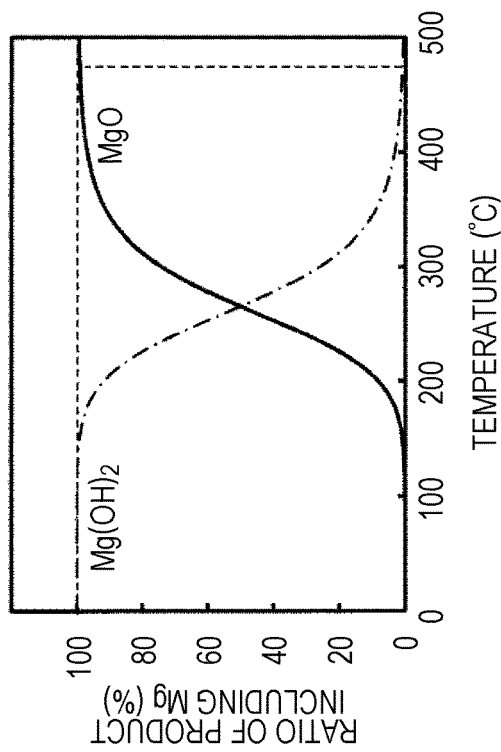
Figure 6:
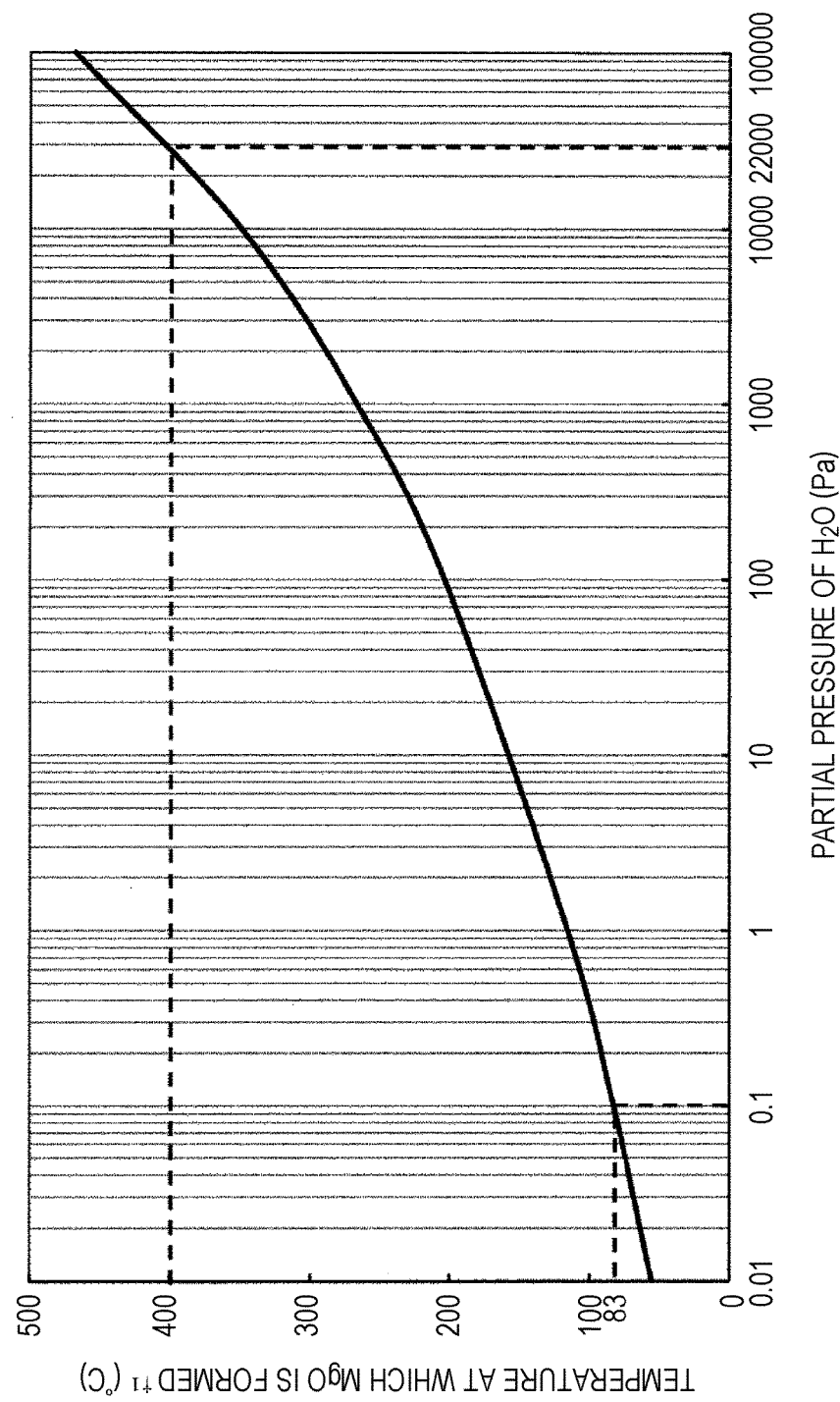
Figure 7:
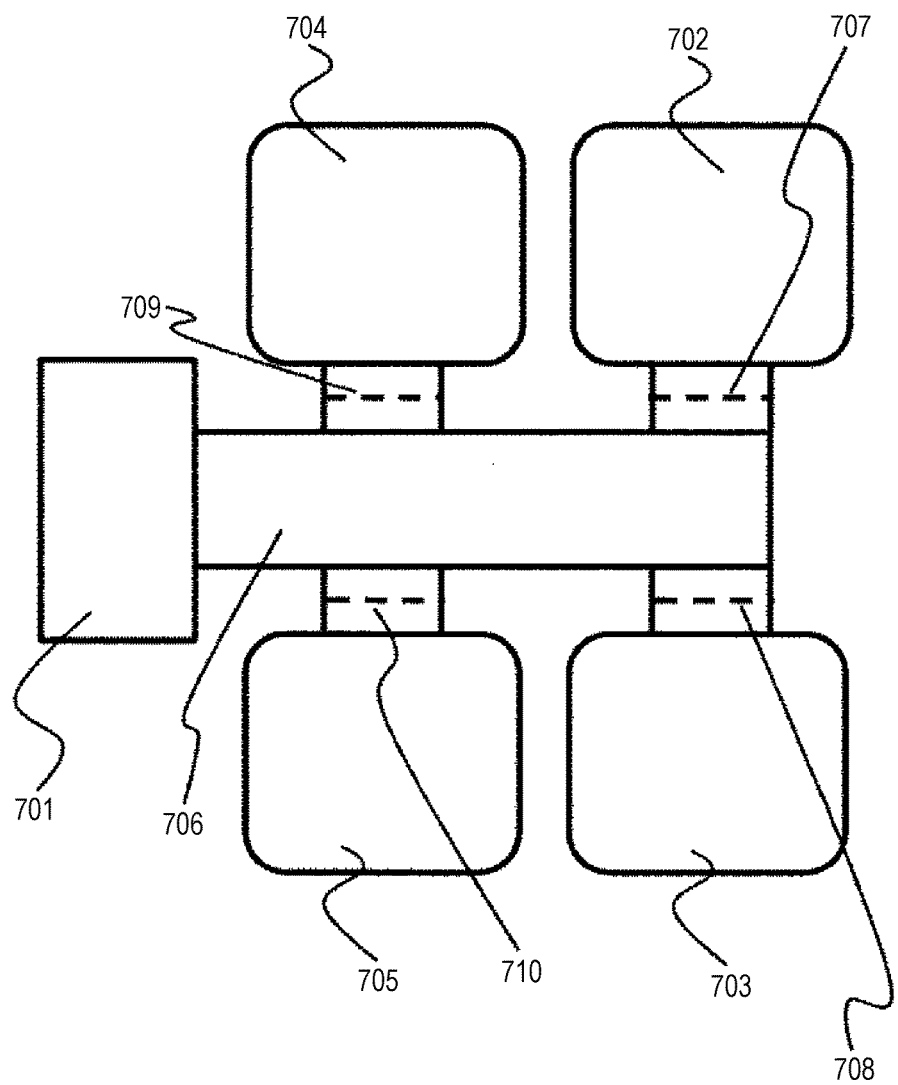
Figure 8:
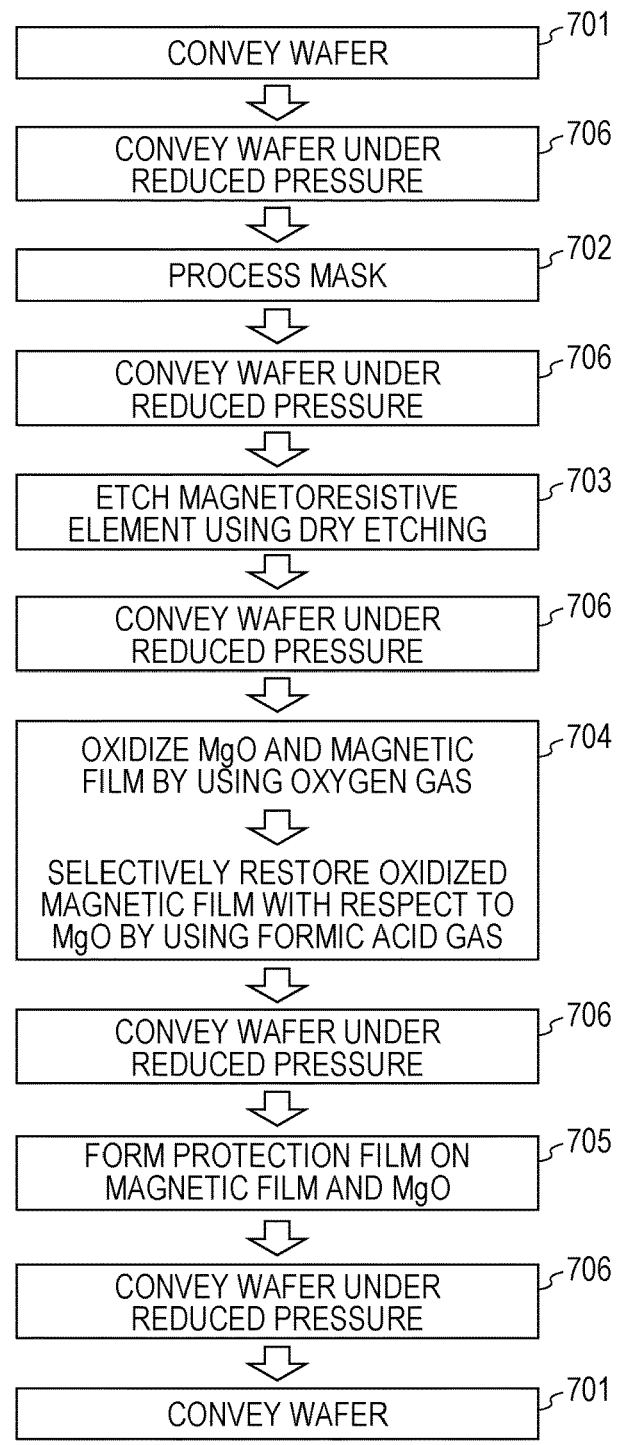
Figure 9:
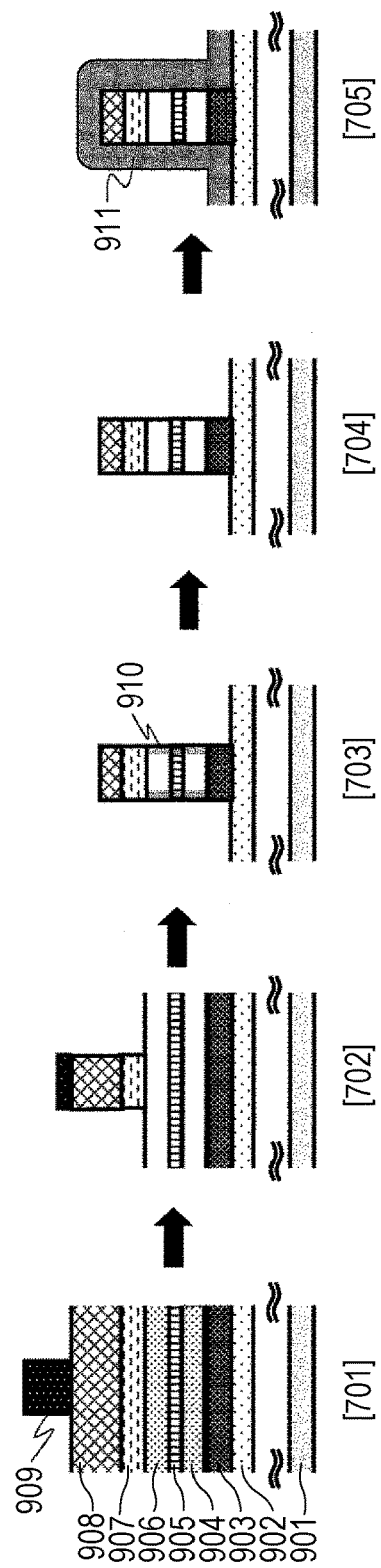
Figure 11A:
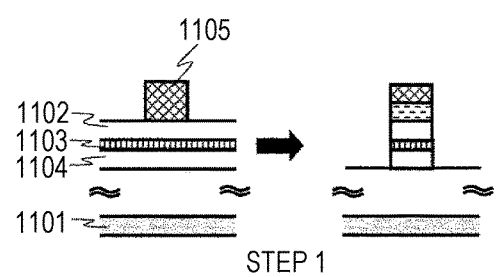
Figure 11B:
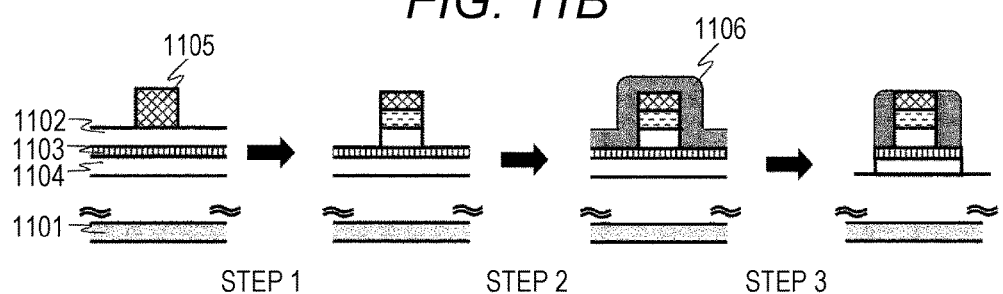

at 102400 Pa and a reaction calculation result of formic acid and magnesium oxide (MgO) at 22000 Pa;

FIG. 4 is a figure illustrating a change of deterioration suppression temperature of magnesium oxide (MgO) at a processing pressure of formic acid;

FIGS. 5A and 5B are figures illustrating a reaction calculation result of $H_2O$ and magnesium oxide (MgO) at 102400 Pa and a reaction calculation result of $H_2O$ and magnesium oxide (MgO) at 0.1 Pa;

FIG. 6 is a figure illustrating a change of a deterioration suppression temperature of magnesium oxide (MgO) according to a partial pressure of $H_2O$;

FIG. 7 is a top view illustrating a manufacturing apparatus of a magnetoresistive element for performing a second embodiment;

FIG. 8 is a process flow for manufacturing a magnetoresistive element by using an apparatus of FIG. 7;

FIG. 9 is a figure illustrating a change of a cross sectional structure of a magnetoresistive element when the process flow of FIG. 8 is performed;

FIG. 10 is a schematic cross sectional view illustrating a recovery apparatus of a magnetoresistive element for performing a third embodiment;

FIGS. 11A and 11B are figures illustrating an etching method of a magnetoresistive element;

FIG. 12 is a table showing each result obtained by calculating a change ($\Delta G$) in energy of Gibbs energy in a typical oxidation reaction caused by oxygen gas of magnesium oxide (MgO) and a magnetic film and calculating a change ($\Delta G$) of Gibbs energy in a typical reduction reaction caused by a formic acid gas (Table 1);

FIG. 13 is a table illustrating a list of reaction products that are considered in the calculation of FIGS. 3A and 3B (Table 2);

FIG. 14 is a table illustrating a list of reaction products that are considered in the calculation of FIGS. 5A and 5B (Table 3); and FIG. 15 is a table illustrating Gibbs energy change in reduction reaction for achieving the first embodiment (Table 4).

DESCRIPTION OF THE PREFERRED EMBODIMENTS

First, the first embodiment for carrying out the present invention will be explained with reference to FIG. 2.

First Embodiment

Figure 1A:
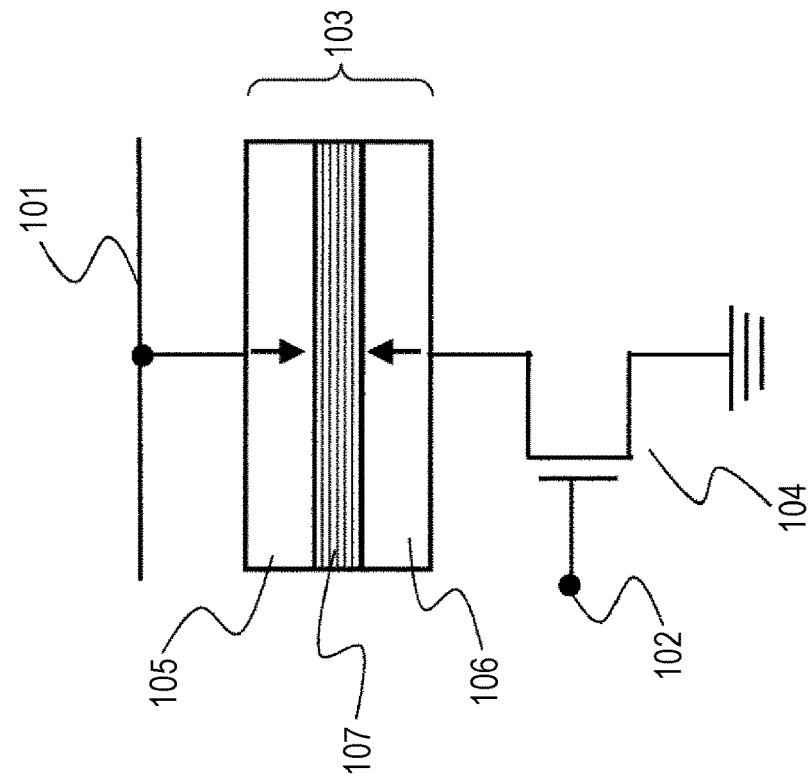
FIGS. 1A and 1B are schematic diagrams illustrating a basic operation principal of a magnetoresistive element.
Figure 1B:
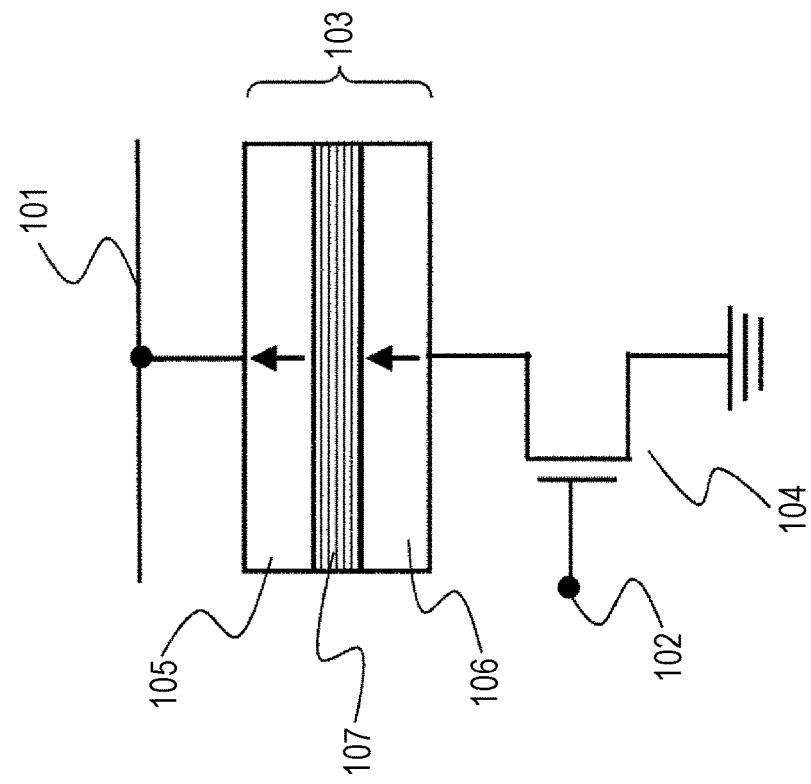
Figure 2:
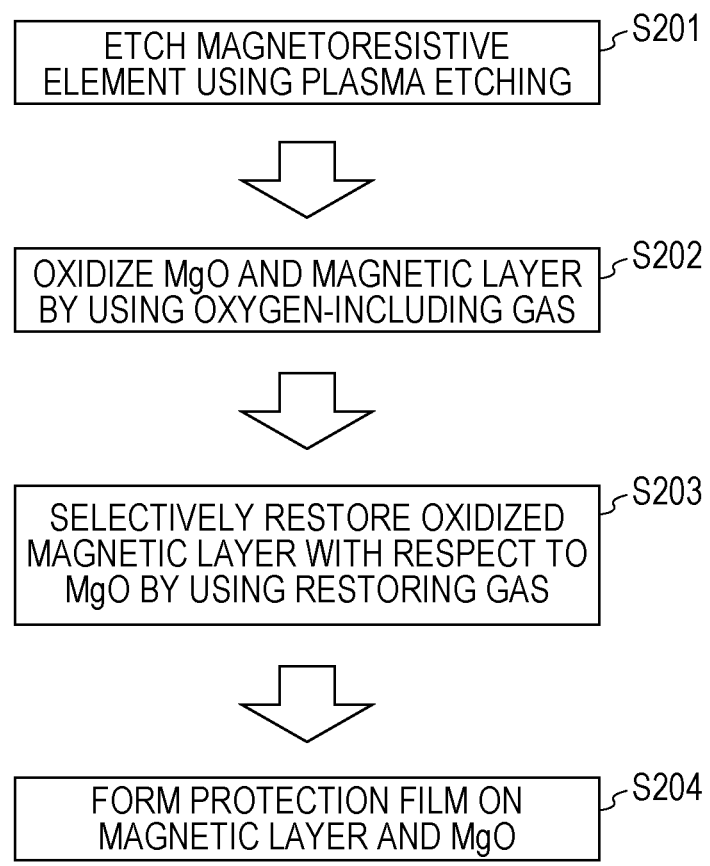
FIG. 2 is a process flow illustrating a first embodiment.

FIG. 2 illustrates a process flow for performing a method of suppressing oxidation of a magnetic film including chemical elements such as Co, Fe, Ni, and the like and suppressing reaction of magnesium oxide (MgO), which is used for a free layer or a fixed layer of the magnetoresistive element.

First, a magnetoresistive element is etched by using plasma etching as shown in step 201. As the method for etching the magnetoresistive element, it is preferable to use plasma etching since the diameter can be enlarged and it has advantageous in mass production property, but it may also be possible to use ion beam etching. In a case where the ion beam etching is used, it is possible to use a method to make a rare gas including He, Ne, Ar, Kr, and Xe, and a reactive gas including chemical elements such as hydrogen, oxygen, nitrogen, and the like into plasma independently, or mixed and made into plasma, and ions generated in the plasma are emitted.

In a case where the plasma etching is used, it is preferable to use a method for making a mixed gas of a CO gas and an $NH_3$ gas into plasma and an etching method using plasma including oxygen chemical elements and hydrogen chemical elements obtained by making a $CH_3OH$ gas into plasma, since a preferable etching shape can be obtained. However, it is possible to use a method to make a rare gas including He, Ne, Ar, Kr, and Xe, and a reactive gas including chemical elements such as hydrogen, oxygen, nitrogen, and the like into plasma independently, or mixed and made into plasma. As the method for etching the magnetoresistive element, two methods are considered, which includes a method for etching a free layer, a magnesium oxide (MgO), and a fixed layer at a time, and a method for etching only the free layer formed as the upper layer of the magnesium oxide (MgO) or only the fixed layer formed as the upper layer of the magnesium oxide (MgO) and not etching all of the magnesium oxide (MgO), but any one of the methods may be used.

In the plasma etching step 201, in a case where the amounts of the hydrogen ions and the hydrogen radicals generated in the plasma during etching are high, or in a case where the energy of the ions generated during etching is high, the reduction of the magnesium oxide (MgO) occurs, and the electrical characteristics of the magnetoresistive element are deteriorated. In a case where the amounts of the oxygen ion and the oxygen radicals generated in the plasma during etching are high, the oxidation of the magnetic film advances, and the electrical characteristics of the magnetoresistive element are deteriorated. In addition, depending on the condition, the reduction of the magnesium oxide (MgO) and the oxidation of the magnetic film occur at a time, and the electrical characteristics of the magnetoresistive element may be deteriorated.

Therefore, it is difficult to uniformly control the reduction state of the magnesium oxide (MgO) and the oxidation state of the magnetic film on the entire surface of the wafer, and the electrical characteristics of the magnetoresistive element are deteriorated because of the reduction of the magnesium oxide (MgO) or the oxidation of the magnetic film and both of them, and the states of them both become ununiform within the wafer surface.

Subsequently, the magnetic film including chemical elements such as Co, Fe, Ni, and the like and the magnesium oxide (MgO), used in the magnetoresistive element with the oxidation processing using the oxygen-including gas as shown in step 202, are oxidized. The method used in the oxidation process of step 202 includes a method for applying thermal treatment to the magnetoresistive element under the atmosphere to which $O_2$ gas has been introduced, thus thermally oxidizing the magnetoresistive element, a method for emitting plasma using $O_2$ gas to the magnetoresistive element, thus oxidizing the magnetoresistive element, a method for emitting only oxygen radicals generated in the plasma using $O_2$ gas to the magnetoresistive element, thus oxidizing the magnetoresistive element, and a method for emitting, to the magnetoresistive element, an ozone gas generated by emitting UV light and the like to $O_2$ gas, thus oxidizing the magnetoresistive element.

The magnesium oxide (MgO) reduced by the plasma etching is oxidized by performing the process of step 202, so that this can recover the deterioration of the electrical characteristics of the magnetoresistive element due to the reduction of the magnesium oxide (MgO). More specifically, all the magnesium oxide (MgO) reduced in the plasma etching can be oxidized, so that the magnesium oxide (MgO) in a state preferable for the entire surface of the wafer can be formed. However, in the process of step 202, not only the magnesium oxide (MgO) but also the magnetic film are oxidized, and therefore, it is impossible to suppress the degradation of the electrical characteristics of the magnetoresistive element due to the oxidation of the magnetic film.

Therefore, it is difficult to uniformly control the oxidation state of the magnetic film on the entire surface of the wafer, and the electrical characteristics of the magnetoresistive element are deteriorated due to the oxidation of the magnetic film, and the oxidation state is also still ununiform within the wafer surface. The plasma etching step in step 201 and the oxidation step of the magnesium oxide (MgO) and the magnetic film in step 202 may be processed by the same apparatus, or may be processed by different apparatuses. However, in a case where the plasma etching step in step 201 and the oxidation step of the magnesium oxide (MgO) and the magnetic film in step 202 are processed by different apparatuses, the magnesium oxide (MgO) has a deliquescent property, and accordingly, the magnesium oxide (MgO) may react with the moisture content in the atmosphere to be deteriorated. Therefore, the wafer is preferably conveyed under a reduced pressure (vacuum state) between step 201 and step 202, and the magnetoresistive element having been etched with plasma in step 201 is preferably not exposed to the atmospheric atmosphere.

Subsequently, the reduction processing using the reducing gas is performed as shown in step 203, so that only the magnetic film oxidized in the process of step 202 is selectively reduced without reducing the magnesium oxide (MgO), and the deterioration of the magnetic characteristics caused by the oxidation of the magnetic film is recovered. More specifically, the deterioration of the magnetic characteristics due to the reduction of the magnesium oxide (MgO) is recovered in the process of step 202, and only the magnetoresistive element oxidized is reduced in the process of step 203, and therefore, this can recover the damages caused by the oxidation of the magnetic film that occur during the plasma etching in step 201 and the oxidation process in step 202.

In the reduction processing in step 203, it is necessary to use a reducing gas of which change ($\Delta G$) of Gibbs energy in the thermal equilibrium state satisfies the condition of Table 4 in the reduction reaction in which $Fe_2O_3$, $Co_3O_4$, NiO, magnesium oxide (MgO) obtained by oxidizing Co, Fe, Ni chemical elements and Mg chemical element used for the magnetic film are caused to react with the reducing gas. When $\Delta G$ is negative, this indicates that the reaction from the left hand side to the right hand side of the equal sign advances spontaneously. When $\Delta G$ is positive, this indicates that the reaction from the left hand side to the right hand side of the equal sign does not advance spontaneously.

More specifically, when a condition that $\Delta G$ is negative is satisfied in $Fe_2O_3$+reducing gas=2Fe+reaction product, which is a reduction reaction between $Fe_2O_3$ and reducing gas, this indicates that the reduction of $Fe_2O_3$ advance spontaneously. When a condition that $\Delta G$ is positive is satisfied in MgO+reducing gas=Mg+reaction product, which is a reduction reaction between the magnesium oxide (MgO) and the reducing gas, this indicates that the reduction of the magnesium oxide (MgO) does not advance spontaneously.

More specifically, when the reducing gas used in the reduction processing in step 203 satisfies the condition of Table 4, only the oxidized magnetic film can be selectively reduced without changing the oxidation state of the magnesium oxide (MgO). Therefore, after the oxidation processing of step 202 is performed, the reduction processing satisfying the condition of Table 4 is performed, so that the magnesium oxide (MgO) and the magnetic film in a preferable state can be formed on the entire surface of the wafer which is the sample.

It should be noted that the reducing gas is preferably hydrogen ($H_2$) gas, a gas including a carboxy group (formic acid (HCOOH) gas, acetic acid ($CH_3COOH$) gas, propionic acid ($CH_3CH_2COOH$) gas and the like) or a gas including an aldehyde group (formaldehyde (HCHO) gas, acetaldehyde ($CH_3CHO$) gas, propionaldehyde ($C_2H_5CHO$) gas, and the like).

It may be possible to use an ammonia ($NH_3$) gas which is a gas including hydrogen chemical elements and nitrogen chemical elements or a hydrogen sulfide ($H_2S$) gas which is a gas including hydrogen chemical elements and sulfur chemical elements. Further, the reducing gas may be obtained by mixing reducing gases with each other in order to accelerate reduction reaction. For example, a gas obtained by mixing a hydrogen ($H_2$) gas and a formic acid (HCOOH) gas may be used as a reducing gas, a gas obtained by mixing a hydrogen ($H_2$) gas and an ammonia ($NH_3$) gas may be used as a reducing gas, and a gas obtained by mixing a hydrogen ($H_2$) gas, a formic acid (HCOOH) gas, and an ammonia ($NH_3$) gas may be used as a reducing gas.

In order to adjust the concentration of the reducing gas, a rare gas such as $N_2$ or He, Ne, Ar, Kr, Xe, and the like inactive against reduction reaction may be mixed and emitted to the magnetoresistive element. However, in a case where the reduction processing is performed by using plasma generated from the reducing gas, radical types such as hydrogen radical and carbon radical generated in plasma have a high level of reactivity, and the reduction reaction of the magnesium oxide (MgO) advances. Therefore, the plasma generated by using the reducing gas in the reduction processing in step 203 is not to be emitted.

However, the oxidation step of the magnesium oxide (MgO) and the magnetic film in step 202 and the reduction step of the oxidized magnetic film in step 203 may be processed by the same apparatus, or may be processed by different apparatuses. However, in a case where the oxidation step of the magnesium oxide (MgO) and the magnetic film in step 202 and the reduction step of the oxidized magnetic film in step 203 are processed by different apparatuses, the magnesium oxide (MgO) may react with a moisture content in the atmosphere to be deteriorated into $Mg(OH)_2$ since the magnesium oxide (MgO) has a deliquescent property. Therefore, the wafer is preferably conveyed under a reduced pressure (vacuum state) between step 202 and step 203, and the magnetoresistive element after the oxidation processing is performed in step 202 is preferably not exposed to the atmospheric atmosphere.

Subsequently, as illustrated in step 204, a protection film is formed on the magnetoresistive element including the magnetic film and the magnesium oxide (MgO). Therefore, even when the magnetoresistive element including the magnetic film and the magnesium oxide (MgO) after step 201 and step 204 are processed are exposed to the atmosphere, the magnetic film is prevented from being oxidized by reacting with oxygen in the atmosphere, and the magnesium oxide (MgO) is prevented from being deteriorated to $Mg(OH)_2$ by reacting with a moisture content in the atmosphere. As the protection film formed in step 204, it is preferable to form a protection film of an insulating material such as SiN, $SiO_2$, $Al_2O_3$, $Ta_2O_5$, $TiO_2$, and the like because they have a high level of barrier property.

However, in a case where a highly conductive material is used as a protection film, the free layer and the fixed layer are short-circuited via the protection film, and the magnetoresistive element does not present preferable electrical characteristics, and therefore, the conductive material is not to be used as the protection film. The method for forming the protection film is not particularly limited, but it is preferable to use sputter method or chemical vapor deposition (CVD) method since they can form a protection film having a preferable coverage under a reduced pressure (vacuum state). It should be noted that the reduction step of the oxidized magnetic film in step 203 and the protection film forming step in step 204 may be processed by the same apparatus, or may be processed by different apparatuses.

However, in a case where the reduction step of the reduction step of the oxidized magnetic film in step 203 and the protection film forming step in step 204 are processed by different apparatuses, the magnetic film may be oxidized by reacting oxygen in the atmosphere, and the magnesium oxide (MgO) may be deteriorated to Mg(OH)$_2$ by reacting with a moisture content in the atmosphere. Therefore, the wafer is preferably conveyed under a reduced pressure (vacuum state) between step 203 and step 204, and the magnetoresistive element after the reduction processing of the magnetic film is performed in step 203 is preferably not exposed to the atmospheric atmosphere.

As described above, the process flow as illustrated in FIG. 2 is performed, so that this suppresses, on the entire surface of the wafer, the oxidation of the magnetic film including chemical elements such as Co, Fe, Ni, and the like used for the free layer or the fixed layer of the magnetoresistive element and the reduction of the magnesium oxide (MgO) can be suppressed on the entire surface of the wafer. Therefore, the magnetic film and the magnesium oxide (MgO) suitable for the entire surface of the wafer can be formed.

Subsequently, the second embodiment carrying out the present invention will be explained.

Second Embodiment

The present embodiment explains a method using formic acid (HCOOH) as reducing gas in a step of reduction processing of a magnetic film in step 203 of FIG. 2 of the first embodiment. Table 1 is a result obtained by calculating a change (ΔG) of Gibbs energy in a thermal equilibrium state at 1 atmosphere (102400 Pa) in a typical oxidation reaction in which Mg chemical element and Co, Fe, Ni chemical elements used in the magnetic film react with oxygen (O$_2$) and a typical reduction reaction in which Fe$_2$O$_3$, Co$_3$O$_4$, NiO, and the magnesium oxide (MgO) obtained by oxidizing these chemical elements react with formic acid.

It should be noted that Table 1 illustrates a calculation value of ΔG at 0° C. and 500° C., and indicates that, when ΔG is negative, the reaction from the left hand side to the right hand side of the equal sign advances spontaneously, and when ΔG is positive, the reaction from the left hand side to the right hand side of the equal sign does not advance spontaneously. More specifically, in a case of 2Fe+1.5O$_2$=Fe$_2$O$_3$ which is oxidation reaction of Fe and O$_2$, ΔG is negative at 0° C. and 500° C., and therefore, this indicates that the oxidation reaction of Fe and O$_2$ advances spontaneously from 0° C. to 500° C., and in a case of MgO+HCOOH=Mg+H$_2$O+CO$_2$ which is reduction reaction of magnesium oxide (MgO) and formic acid, ΔG is positive at 0° C. and 500° C., and therefore, this indicates that the reduction reaction of magnesium oxide (MgO) and HCOOH does not advance spontaneously from 0° C. to 500° C.

In Table 1, it is understood that ΔG has a negative value in the oxidation reaction of the magnetic material and Mg, and the oxidation reaction of the magnetic material and Mg with O$_2$ advances spontaneously. On the other hand, it is understood that, in the reduction reaction with the formic acid, ΔG has a positive value in the reduction reaction of Fe$_2$O$_3$, CO$_3$O$_4$, NiO which are magnetic materials, and the reduction reaction of the oxidized magnetic film advances spontaneously, but ΔG has a negative value in the reduction reaction of the formic acid and the magnesium oxide (MgO), and the reduction reaction of the magnesium oxide (MgO) does not advance spontaneously.

More specifically, in the oxidation step of the magnesium oxide (MgO) and the magnetic film using the oxygen gas in the process of step 202 of FIG. 2, this means that the oxidation of the magnesium oxide (MgO) and the magnetic film advances, and even if the amount of oxygen in the magnesium oxide (MgO) decreases during plasma etching in step 201 and the magnesium oxide (MgO) is reduced, the damage of the magnesium oxide (MgO) can be recovered by causing the reduced magnesium oxide (MgO) and the oxygen gas to react with each other in the process of step 202. Therefore, the magnesium oxide (MgO) in a preferable state can be formed on the entire surface of the wafer. In the process of step 202, not only the magnesium oxide (MgO) but also the magnetic film are oxidized, but in the process of step 203, the formic acid can selectively reduce only the oxidized magnetic film, and therefore, this can suppresses the oxidation of the magnetic film including chemical elements such as Co, Fe, Ni, and the like used for the free layer or the fixed layer of the magnetoresistive element, and this can suppress the reduction of the magnesium oxide (MgO). Therefore, the magnetic film and the magnesium oxide (MgO) in a preferable state can be formed on the entire surface of the wafer.

However, in a case where plasma generated by using a formic acid gas is emitted onto the magnetoresistive element in the process of step 203, the hydrogen radicals and the carbon radicals generated in the plasma have a high level of reactivity, and not only the oxidized magnetic film but also the magnesium oxide (MgO) are reduced. Therefore, the plasma generated by using the formic acid gas is not to be emitted to the magnetoresistive element, and the formic acid gas is preferably directly emitted to the magnetoresistive element. However, it may be possible to mix a nitrogen (N$_2$) gas or a rare gas such as He, Ne, Ar, Kr, Xe, and the like inactive against reaction of the magnetoresistive element in order to adjust the concentration of the formic acid gas.

On the other hand, a magnesium included in the magnesium oxide (MgO) is known to be a material that is likely to be a material that is likely to be a carbonate and a hydroxide, and in the step of emitting a formic acid-including gas onto the magnetoresistive element in step 203, the reduction reaction of the magnesium oxide (MgO) can be suppressed, but when MgCO$_3$ and Mg(OH)$_2$ are formed, the magnesium oxide (MgO) is deteriorated, and the electrical characteristics of the magnetoresistive element may deteriorate. The magnesium oxide (MgO) is a material having a deliquescent property, and in the process for manufacturing the magnetoresistive element in step 201, step 202, step 203, and step 204, Mg(OH)$_2$ is formed by the moisture content remaining in the vacuum container, so that the magnesium oxide (MgO) is deteriorated, and accordingly, the electrical characteristics of the magnetoresistive element are deteriorated, and it may be impossible to form the magnesium oxide (MgO) in a preferable state on the entire surface of the wafer.

FIG. 3A illustrates a result obtained by calculating, at 102400 Pa, a ratio of a product including Mg formed through reaction of the magnesium oxide (MgO) and the formic acid. FIG. 3B illustrates a result obtained by calculating, at 22000 Pa, a ratio of a product including Mg formed through reaction of the magnesium oxide (MgO) and the formic acid. It should be noted that the calculation is performed in a range of 0° C. to 500° C. In this calculation, in the actual process, a sufficient amount of formic acid is supplied to the magnesium oxide (MgO), and therefore, the amount of product obtained by introducing HCOOH of fifth the amount of the magnesium oxide (MgO) by mole is estimated from a value where the Gibbs energy is the minimum in the thermal equilibrium state, and a ratio occupied by magnesium oxide (MgO), $Mg(OH)_2$, $MgCO_3$ which are products mainly including Mg among them is output.

It should be noted that the products assumed in the calculation is described in Table 2. In the calculation of FIGS. 3A and 3B, a ratio of a product including Mg in addition to Mg, $MgH_2$, and the like is also calculated, but the ratio thereof is equal to or less than 1% at all the temperatures, and is not described in FIGS. 3A and 3B. As seen in FIGS. 3A and 3B, it is understood that, when the processing pressure force is 102400 Pa in the reaction of the formic acid and the magnesium oxide (MgO), the ratio of the magnesium oxide (MgO) in the product including Mg is 99% or more, and a temperature of 493° C. or more is required in order to suppress deterioration of the magnesium oxide (MgO), but in a case where the processing pressure of the formic acid is reduced to a pressure of 22000 Pa or less, the deterioration of the magnesium oxide (MgO) is suppressed at a temperature equal to or more than 400° C. More specifically, when the processing pressure of the formic acid is reduced, the temperature at which the deterioration of the magnesium oxide (MgO) can be suppressed can be reduced.

FIG. 4 indicates that, at each processing pressure of the formic acid, the amount of product obtained by introducing HCOOH of fifth the amount of the magnesium oxide (MgO) by mole is estimated from a value where the Gibbs energy is the minimum in the thermal equilibrium state, and a temperature where a ratio occupied by magnesium oxide (MgO) in products mainly including Mg among them is 99% or more is output as the deterioration suppression temperature of the magnesium oxide (MgO). It should be noted that the products assumed in the calculation is described in Table 2.

When the magnetoresistive element is heated at a temperature higher than 400° C., the electrical characteristics are deteriorated, and therefore, the reduction processing of the oxidized magnetic film with the formic acid is preferably performed at 400° C. or less. Therefore, the reduction processing with the formic acid is preferably processed while the processing pressure of the formic acid is equal to or less than 22000 Pa. On the other hand, the frequency at which the formic acid collides with the magnetoresistive element is proportional to the processing pressure force of the formic acid, and when the processing pressure force becomes 0.1 Pa or less, the number of times the formic acid and the magnetoresistive element collide with each other becomes $1\times10^{-6}$ or less of the number in the atmosphere, and the reduction speed of the oxidized magnetic film with the formic acid significantly decrease. Therefore, the processing pressure force is preferably 0.1 Pa or more, and as can be seen from FIG. 4, in order to suppress the deterioration of the magnesium oxide (MgO) at 0.1 Pa or more, the processing temperature in the reduction processing with the formic acid is preferably equal to or more than 107° C.

More specifically, in the process of step 203 of FIG. 2, in order to suppress the suppression of the magnesium oxide (MgO) and reduce the oxidized magnetic film by using the formic acid gas for the reducing gas, the processing pressure force in the processing chamber during emission of the formic acid gas and the processing temperature of the wafer formed with the magnetoresistive element are preferably processed within a range as indicated by 401 of FIG. 4. More specifically, the pressure force in the processing chamber when the formic acid gas is emitted to the magnetoresistive element is made into a pressure within a range of 0.1 Pa to 22000 Pa, and the processing temperature of the wafer having the magnetoresistive element formed thereon is preferably a temperature within a range of 107° C. to 400° C.

In addition, it is difficult to perform all of the following different processing in the same vacuum container: the plasma etching step of the magnetoresistive element in step 201, the oxidation of the magnetic film step of the magnesium oxide (MgO) using the oxygen-including gas in step 202, the reduction step of the oxidized magnetic film using the formic acid-including gas in step 203, and the protection film forming step on the magnetic film and the magnesium oxide (MgO) in step 204, and it is preferable to process the wafer formed with the magnetoresistive element by using two or more different vacuum containers.

However, when the wafer is exposed to the atmosphere when the wafer is moved between multiple different vacuum containers, the magnesium oxide (MgO) and the moisture content in the atmosphere react with each other to form $Mg(OH)_2$, and the characteristics of the magnetoresistive element are deteriorated by the deterioration of the magnesium oxide (MgO). Therefore, by interposing a conveyance chamber maintained under a reduced pressure (vacuum state), the wafer formed with the magnetoresistive element is preferably conveyed and moved between different vacuum containers. However, even in this conveyance chamber, it is difficult to completely remove the residual moisture content, and $Mg(OH)_2$ may be formed due to the moisture content remaining in this conveyance chamber.

FIG. 5A illustrates a result obtained by calculating, at 102400 Pa, a ratio of a product including Mg formed through reaction of the magnesium oxide (MgO) and $H_2O$. FIG. 5B illustrates a result obtained by calculating, at 0.1 Pa, a ratio of a product including Mg formed through reaction of the magnesium oxide (MgO) and $H_2O$. It should be noted that this calculation is performed within a range of 0° C. to 500° C. In this calculation, the amount of product obtained by introducing $H_2O$ of fifth the amount of the magnesium oxide (MgO) by mole is estimated from a value where the Gibbs energy is the minimum in the thermal equilibrium state, and a ratio occupied by magnesium oxide (MgO), $Mg(OH)_2$ which are products mainly including Mg among them is calculated.

It should be noted that the products assumed in the calculation is described in Table 3. In the calculation of FIGS. 5A and 5B, a ratio of products including Mg and other Mg such as $MgH_2$ is calculated, but the ratio thereof is 1% or less, which is not described in FIGS. 5A and 5B. As seen in FIGS. 5A and 5B, it is understood that, when the processing pressure force is 102400 Pa in the reaction of $H_2O$ and the magnesium oxide (MgO), the ratio of the magnesium oxide (MgO) in the product including Mg is 99% or more, and a temperature of 463° C. or more is required in order to suppress deterioration of the magnesium oxide (MgO), but in a case where the processing pressure of $H_2O$ is reduced to a pressure of 0.1 Pa, the deterioration of the magnesium oxide (MgO) is suppressed at a temperature equal to or more than 84° C.

FIG. 6 indicates that, at each processing pressure force, the amount of product obtained by introducing $H_2O$ of fifth the amount of the magnesium oxide (MgO) by mole is estimated from a value where the Gibbs energy is the minimum in the thermal equilibrium state, and a temperature where a ratio occupied by magnesium oxide (MgO) in products including Mg among them is 99% or more is output as the deterioration suppression temperature of the magnesium oxide (MgO). It should be noted that the products assumed in the calculation is described in Table 3.

The amount of residual moisture content in the conveyance chamber is determined by the ultimate vacuum of the conveyance chamber, and when the performance of the vacuum pump is considered, it is preferable to operate while the partial pressure of $H_2O$ is within the range of 0.1 Pa to 10000 Pa. More specifically, in order to suppress the deterioration of the magnesium oxide (MgO), it is desirable to hold the temperature of the conveyed wafer at 83° C. or more. However, it is difficult to provide a heating mechanism to the conveyed wafer in the conveyance chamber, and the temperature of the conveyed wafer is equal to or less than the processing temperature in the plasma etching step of the magnetoresistive element in step 201, the oxidation step of the magnesium oxide (MgO) and the magnetic film using the oxygen-including gas in step 202, and the reduction step of the oxidized magnetic film using the formic acid-including gas in step 203.

More specifically, the processing temperature of the wafer formed with the magnetoresistive element in the process of step 201, step 202, and step 203 is preferably equal to or more than 83° C. When the magnetoresistive element is heated at a temperature more than 400° C., the electrical characteristics are deteriorated. Therefore, the processing temperatures in the plasma etching step of the magnetoresistive element in step 201, the oxidation step of the magnesium oxide (MgO) and the magnetic film using the oxygen-including gas in step 202, and the reduction step of the oxidized magnetic film using the formic acid-including gas in step 203 are preferably equal to or more than 83° C. and equal to or less than 400° C.

Subsequently, the third embodiment for carrying out the present invention will be explained with reference to FIG. 7, FIG. 8, and FIG. 9.

Third Embodiment

FIG. 7 is a schematic diagram illustrating a typical apparatus for carrying out the present invention when the typical apparatus is seen from an upper surface. FIG. 8 illustrates a process flow for manufacturing a magnetoresistive element using the apparatus of FIG. 7. FIG. 9 illustrates a change of a cross sectional structure of a typical magnetoresistive element when the process flow of FIG. 8 is performed. Overall, this apparatus includes a wafer conveying chamber 701, a first etching apparatus 702, a second etching apparatus 703, a recovery apparatus 704, and a protection film forming apparatus 705, and has such a structure that each apparatus is connected to the conveyance chamber 706 via gate valves 707 to 710.

First, a wafer formed with a predetermined film to be used as a magnetoresistive element is set in the wafer conveying chamber 701, and the pressure is reduced to a predetermined pressure force in the wafer conveyance chamber. As illustrated in FIG. 9, overall, this wafer which is a sample includes a Si substrate 901, an electrode film 902, a base layer 903 for controlling crystallinity of a fixed layer and stabilizing magnetization of the fixed layer, a fixed layer 904 made of a magnetic material including chemical elements such as Co, Fe, Ni, a magnesium oxide (MgO) 905, a free layer 906 made of a magnetic material including chemical elements such as Co, Fe, Ni, a cap layer 907 protecting a free layer, and a hard mask 908, and a resist 909 of a predetermined pattern is formed on the hard mask 908.

Although not described in FIG. 9, a transistor for selecting each resistance element and a wire for joining each element are formed between the Si substrate 901 and the electrode film 902. In this case, the hard mask 908 is used as a mask for processing a magnetoresistive element as a mask, and the hard mask 908 is preferably made of a Si-including material such as SiN, $SiO_2$, amorphous Si, and the like, a C-including material such as diamond-like carbon and carbon nitride, and a metal material such as Ta, TaN, Ti, TiN, Ru, and the like. It should be noted that the structure of the magnetoresistive element to which the present invention is applied is not limited to the above, and in particular, the film structure thereof is not limited as long as it has at least the fixed layer 904 made of the magnetic material, the magnesium oxide (MgO) 905, and the free layer 906 made of the magnetic material. Alternatively, there may be two or more combinations of the fixed layer 904, the magnesium oxide (MgO) 905, and the free layer 906.

In FIG. 9, the fixed layer 904 is formed at the lower side of the magnesium oxide (MgO) 905, and the free layer 906 is at the upper side of the magnesium oxide (MgO) 905. Alternatively, this may be such a structure that a free layer may be formed at the lower side of the magnesium oxide (MgO), and a fixed layer is formed at the upper side of the magnesium oxide (MgO).

Subsequently, the wafer that is set in the wafer conveying chamber 701 passes through the wafer conveyance chamber 706, and is moved to the first etching apparatus 702 under a reduced pressure (vacuum state), so that the hard mask 908 and the cap layer 907 are processed. The first etching apparatus 702 is a plasma etching apparatus, and is an apparatus for independently introducing a halogen gas such as $Cl_2$, $BCl_3$, $CCl_4$, $CF_4$, $SF_6$, $CHF_3$, $C_4F_6$, HBr, and the like, an oxygen-including gas such as $O_2$, $CO_2$, CO, and the like, a carbon-including gas such as $CH_4$, and a rare gas such as He, Ne, Ar, Kr, Xe, and the like, or mixing and introducing multiple types of the halogen gas such as $Cl_2$, $BCl_3$, $CCl_4$, $CF_4$, $SF_6$, $CHF_3$, $C_4F_6$, HBr, and the like, the oxygen-including gas such as $O_2$, $CO_2$, CO, and the like, the carbon-including gas such as $CH_4$, and the rare gas such as He, Ne, Ar, Kr, Xe, and the like into the vacuum container, adjusting the pressure force to attain 0.1 Pa to 100 Pa, and thereafter, performing etching by using plasma formed by applying the source electric power.

It should be noted that the electric discharge method may use magneto-active field microwave type, Inductively Coupled Plasma type, Capacitively Coupled Plasma, and the like, but the electric discharge method is not particularly limited. In order to draw ions in the plasma are actively to the wafer, it is preferable to apply radio frequency electric power to the stage where the wafer is disposed. In the first etching apparatus, it is not necessary to process all the cap layer 907. It may be possible to process only the hard mask 908, or process the cap layer halfway. It is desirable to select an optimum method in accordance with the film configuration of the hard mask and the cap layer.

Subsequently, the wafer on which predetermined processing is performed by the first etching apparatus 702 passes through the wafer conveyance chamber 706, moves to the second etching apparatus 703 under a reduced pressure (vacuum state), and etches the base layer 903, the fixed layer 904, the magnesium oxide (MgO) layer 905, and the free layer 906. The second etching apparatus preferably uses plasma etching since the diameter can be enlarged and it has advantageous in mass production property, but it may also be possible to use ion beam etching. In a case where the ion beam etching is used, a method is used to make a rare gas including He, Ne, Ar, Kr, and Xe, and a reactive gas including chemical elements such as hydrogen, oxygen, nitrogen, and the like into plasma independently, or mix and make the rare gas including He, Ne, Ar, Kr, and Xe, and the reactive gas including chemical elements such as hydrogen, oxygen, nitrogen, and the like into plasma, and emit ions generated in the plasma.

In a case where the plasma etching is used, it is preferable to use a method for making a mixed gas of CO and $NH_3$ into plasma and an etching method using plasma including oxygen and hydrogen-including plasma obtained by making a $CH_3OH$ gas into plasma, since a preferable etching shape can be obtained. However, a rare gas such as He, Ne, Ar, Kr, Xe, and the like, and a reactive gas including chemical elements such as hydrogen, oxygen, nitrogen, and the like may be made into plasma independently, or may be mixed and made into plasma to be used. It should be noted that the method for etching the magnetoresistive element includes the method for etching the free layer, the magnesium oxide (MgO), and the fixed layer at a time as described in step 1 of FIG. 11A, and the method for etching only the free layer formed at the upper side of the magnesium oxide (MgO), so that the magnesium oxide (MgO) is not completely etched, as describe in step 1 of FIG. 11B.

In the processing flow of FIG. 9, the method for causing the second etching apparatus 703 to etch the free layer, the magnesium oxide (MgO), and the fixed layer at a time is described, but only the free layer 906 may be processed. In this step, in a case where there are a lot of hydrogen ions and hydrogen radicals generated in the plasma during etching, or in a case where the energy of the ions emitted during etching is high, the electrical characteristics of the magnetoresistive element are deteriorated by the damaged layer 910 formed when the reduction of the magnesium oxide (MgO) occurs.

In a case where there are a lot of oxygen ions and oxygen radicals generated in the plasma during etching, the electrical characteristics of the magnetoresistive element are deteriorated by the damaged layer 910 formed when the oxidation of the magnetic film advances. In addition, depending on the condition, the electrical characteristics of the magnetoresistive element may be deteriorated by the damaged layer 910 formed when the reduction of the magnesium oxide (MgO) and the oxidation of the magnetic film occur at a time. Therefore, it is difficult to uniformly control the reduction state of the magnesium oxide (MgO) and the oxidation state of the magnetic film on the entire surface of the wafer, and the electrical characteristics of the magnetoresistive element are deteriorated by the reduction of the magnesium oxide (MgO) or the oxidation of the magnetic film and both of them, and the states of them both become ununiform within the wafer surface.

Subsequently, the wafer on which predetermined processing is performed by the second etching apparatus 703 passes through the wafer conveyance chamber 706, moves to the recovery apparatus 704 under a reduced pressure (vacuum state). The recovery apparatus 704 includes a function for oxidizing the magnesium oxide (MgO) and the magnetic film including chemical elements such as Co, Fe, Ni used for the fixed layer 904 or the free layer 906 and the function of reducing only the magnetic film by using the formic acid gas, and performs the reduction processing using the formic acid gas after the oxidation processing is performed, so that the magnesium oxide (MgO) and the magnetic film can be formed in a preferable state on the entire surface of the wafer because of the reasons described in the second embodiment.

In the oxidation step, the following methods are used: a method for thermally oxidizing a magnetoresistive element by applying thermal treatment to a magnetoresistive element under an atmosphere to which $O_2$ gas has been introduced, a method for thermally oxidizing a magnetoresistive element by emitting plasma using $O_2$ gas to the magnetoresistive element, a method for thermally oxidizing a magnetoresistive element by emitting only the oxygen radicals generated in plasma using $O_2$ gas to the magnetoresistive element, or a method for thermally oxidizing a magnetoresistive element by emitting, to the magnetoresistive element, ozone generated by emitting UV light and the like to $O_2$ gas.

The recovery apparatus may have such a structure to be divided into a first recovery apparatus having a function of oxidizing the magnesium oxide (MgO) and the magnetic film including chemical elements such as Co, Fe, Ni and a second recovery apparatus having a function of reduction processing of only the magnetic film by using the formic acid gas, and configured such that the first recovery apparatus and the second recovery apparatus are joined with a wafer conveyance chamber, but in order to reduce the footprint of the apparatus, a single apparatus preferably includes the function of oxidation and the function of reduction.

After the second etching apparatus 703 performs the predetermined etching, a step of oxidizing the magnesium oxide (MgO) and the magnetic film including chemical elements such as Co, Fe, Ni, and the like may be performed, and the recovery apparatus 704 may perform only the reduction processing using the formic acid gas, but the processing is preferably performed by a different apparatus, so that impurities generated during etching are less likely to remain in the second etching apparatus and mixed as impurities during the oxidation processing.

Subsequently, the wafer to which the predetermined processing is performed by the recovery apparatus 704 passes through the wafer conveyance chamber 706, moves to the protection film forming apparatus 705 under a reduced pressure (vacuum state), and forms the protection film 911. Since the protection film 911 has a high level of barrier property, it is preferable to form a protection film of insulating materials such as SiN, $SiO_2$, $Al_2O_3$, $Ta_2O_5$, $TiO_2$, and the like.

In a case where a highly conductive material is used for the protection film, the free layer and the fixed layer are short-circuited via the protection film, and the magnetoresistive element does not present preferable electrical characteristics, and therefore, the conductive material is not to be used as the protection film. The method for forming the protection film is not particularly limited, but it is preferable to use sputter method or chemical vapor deposition (CVD) method since they can form a protection film having a preferable coverage under a reduced pressure (vacuum state). Subsequently, the wafer to which predetermined processing is performed by the protection film forming apparatus 705 passes through the wafer conveyance chamber 706, moves to the wafer conveying chamber 701, and the wafer is pressurized to the atmospheric pressure, and thereafter, the wafer is discharged.

As described above, the damage to the magnesium oxide (MgO) and the magnetic film generated during dry etching of the magnetoresistive element can be recovered by processing the wafer formed with the magnetoresistive element by using the apparatus described in the present embodiment, and the magnetoresistive element capable of achieving both of the oxidation suppression of the magnetic film and the reduction suppression of the magnesium oxide (MgO) can be manufactured.

Subsequently, the recovery apparatus according to the present invention will be explained.

Fourth Embodiment

FIG. 10 illustrates a schematic diagram of a recovery apparatus for carrying out the present invention. In order to recover the damage to the magnesium oxide (MgO) and the magnetic film generated when the magnetoresistive element is dry etched, this apparatus illustrates a structure of a recovery apparatus having a function for oxidizing magnesium oxide (MgO) and magnetic material including chemical elements such as Co, Fe, Ni, and the liked used for the fixed layer or the free layer and a function of reducing only the magnetic material by using a formic acid-including gas.

It should be noted that this apparatus may be used alone, but when the wafer formed with the magnetoresistive element is conveyed in the atmosphere to the recovery apparatus after the magnetoresistive element is dry etched, the magnesium oxide (MgO) may be deteriorated by reaction with the moisture content in the atmosphere. Therefore, the wafer is preferably conveyed under a reduced pressure (vacuum state) between the plasma etching apparatus and the recovery apparatus, and in particular, it is preferable to use this recovery apparatus to 704 of FIG. 7 explained in the third embodiment. An embodiment in a case where this apparatus is applied to 704 of FIG. 7 will be hereinafter explained.

The wafer 1001 formed with the magnetoresistive element formed with the magnetoresistive element is dry etched under a predetermined condition, and thereafter, the wafer 1001 moves to the wafer conveyance chamber 706. Thereafter, the wafer passes through the gate valve 1002 to be conveyed into the vacuum container 1003, and is disposed on the wafer placement base 1004 which is a sample base. The wafer placement base 1004 includes a ring-shaped wafer support member 1005, and has such a structure that the wafer 1001 formed with the conveyed magnetoresistive element is not displaced during processing. A heating mechanism 1006 is provided at the lower portion of the wafer placement base to heat and maintain the wafer at a predetermined temperature, so that the temperature of the wafer during processing can be set to any given temperature.

After the wafer 1001 formed with the magnetoresistive element is disposed on the wafer placement base, valves 1007, 1008 are opened, and a valve 1009 and a valve 1012 are closed, so that an oxygen-including gas 1011 is introduced only from a first gas introduction hole 1010. The oxygen-including gas 1011 is a gas including an oxygen chemical element, and may be an oxygen gas, an ozone gas, an oxygen radical or a gas obtained by mixing these gases with an $N_2$ gas and a rare gas including He, Ne, Ar, Kr, Xe inactive against the magnetoresistive element. At this occasion, a pressure force adjustment mechanism 1012 adjusts the exhaust speed, so that the vacuum container can be adjusted to a predetermined pressure force.

According to the above procedure, the oxygen-including gas 1011 can be emitted under a predetermined pressure force to the wafer heated to a predetermined temperature by the heating mechanism 1006, and the magnetic material and the magnesium oxide (MgO) in the magnetoresistive element can be oxidized. More specifically, the magnesium oxide (MgO) reduced in the plasma etching is oxidized, and the deterioration of the electrical characteristics of the magnetoresistive element due to the reduction of the magnesium oxide (MgO) can be recovered. When the oxygen-including gas and the magnesium oxide (MgO) are caused to react with each other for a predetermined time, all the magnesium oxide (MgO) within the wafer surface reduced in the plasma etching can be oxidized, and the magnesium oxide (MgO) in a state preferable for the entire surface of the wafer can be formed.

However, as described above, the magnetic film is also oxidized in the oxidation step, and therefore, the deterioration of the electrical characteristics of the magnetoresistive element due to the oxidation of the magnetic film cannot be suppressed. Therefore, it is difficult to uniformly control the oxidation state of the magnetic film on the entire surface of the wafer, and the electrical characteristics of the magnetoresistive element are deteriorated due to the oxidation of the magnetic film, and the oxidation state is still ununiform within the wafer surface.

Subsequently, after all the oxygen-including gas introduced into the vacuum container 1003 is exhausted, the valve 1012 is opened, so that the formic acid-including gas 1014 is introduced from the second gas introduction hole 1013. The formic acid-including gas 1014 is a gas including the formic acid (HCOOH), and is a gas obtained by mixing the formic acid gas with an $N_2$ gas and a rare gas including He, Ne, Ar, Kr, Xe inactive against the magnetoresistive element. At this occasion, the pressure force adjustment mechanism 1012 adjusts the exhaust speed, so that the vacuum container can be adjusted to a predetermined pressure force.

According to the above procedure, the formic acid-including gas 1014 can be emitted to the wafer heated to the predetermined temperature by the heating mechanism 1006 under a predetermined pressure force, and because of the reasons explained in the second embodiment, only the magnetic material oxidized in the oxidation step of the magnesium oxide (MgO) and the magnetic film and the plasma etching can be selectively reduced without reducing the magnesium oxide (MgO) in the magnetoresistive element. When the formic acid-including gas and the magnetic film are caused to react with each other for a predetermined time, all the magnetic film within the wafer surface oxidized in the oxidation step and the plasma etching can be reduced, and the magnetic film in a state preferable for the entire surface of the wafer can be formed.

More specifically, after the magnetic film and the magnesium oxide (MgO) are oxidized in the oxidation step using the oxygen-including gas, the magnetic film oxidized in the reduction step using the formic acid-including gas is reduced, so that the damage caused by the oxidation of the magnetic film generated in the oxidation process using the oxygen-including gas during the plasma etching can be recovered, and the magnesium oxide (MgO) and the magnetic film in a preferable state can be formed on the entire surface of the wafer.

In a case where multiple wafers are processed, it is necessary to repeatedly perform an introduction of an oxygen-including gas from the first gas introduction hole 1010 and an introduction of a formic acid-including gas from the second gas introduction hole 1013, but in a case where the temperature in the vacuum container is low, and the formic acid-including gas is attached to the inner wall of the vacuum container 1003, the attached formic acid-including gas is mixed during introduction of the oxygen-including gas and the moisture content ($H_2O$) is formed, so that this may obstruct the oxidation of the magnesium oxide (MgO). Therefore, the heating mechanism 1006 is preferably disposed on the vacuum container inner wall to maintain the inner wall of the vacuum container at a temperature of equal to or more than 80° C., so that the attachment of the formic acid-including gas into the vacuum container is suppressed.

In a case where the formic acid-including gas attaches into the first gas introduction hole 1010 when the formic acid-including gas is introduced from the second gas introduction hole 1013 into the vacuum container, the attached formic acid-including gas is mixed during introduction of the oxygen-including gas, and this may block the oxidation of the magnesium oxide (MgO). Therefore, the valve 1012 is opened, and immediately before the formic acid-including gas is introduced from the second gas introduction hole, the valve 1007 is closed, and the valves 1008 and 1009 are opened, so that the formic acid mixing suppression gas 1015 is introduced from the first gas introduction hole 1010, so that the first gas introduction hole is preferably caused to be in a positive pressure with respect to the inside of the vacuum container, and the attachment of the formic acid-including gas to the first gas introduction hole 1010 is preferably suppressed. It should be noted that the formic acid mixing suppression gas 1015 is preferably a gas inactive against the magnetoresistive element, is preferably a gas obtained by mixing an $N_2$ gas and a rare gas including He, Ne, Ar, Kr, Xe, and the like.

Finally, after the reduction processing of the oxidized magnetic film using the formic acid-including gas is completed, the wafer 1001 formed with the magnetoresistive element disposed on the wafer placement base 1004 is conveyed to the wafer conveyance chamber 706.

When the recovery apparatus according to the present embodiment is used, the damage to the magnesium oxide (MgO) and the magnetic film generated during the plasma etching of the magnetoresistive element can be recovered by processing the wafer formed with the magnetoresistive element, and this enables manufacturing of the magnetoresistive element that achieves not only the oxidation suppression of the magnetic film but also the reduction suppression of the magnesium oxide (MgO).

In order to improve the throughput, the temperature of the heating mechanism 1006 is preferably the same temperature as the oxidation step using the oxygen-including gas and the reduction step using the formic acid-including gas, and as described in the first embodiment, the processing temperature using the formic acid-including gas of the magnesium oxide (MgO) is equal to or more than 107° C. and equal to or less than 400° C., and therefore, the temperature of the heating mechanism 1006 is preferably set to any given value equal to or more than 107° C. and equal to or less than 400° C.

In the above embodiment, the magnesium oxide (MgO) has been explained as the barrier layer of the magnetoresistive element, but the barrier layer of the magnetoresistive element may also be oxidation aluminum ($Al_2O_3$). More specifically, the barrier layer of the magnetoresistive element according to the present invention may be a metal oxidation film. In the above embodiment, an example of performing a protection film forming step after the reduction step has been explained, but the present invention does not necessarily require this protection film forming step, and the protection film forming step may not be necessary.

As described above, the present invention is as described above in each embodiment, but in the technical concept of the present invention, the present invention is not limited to "the oxidized magnetic film is selectively reduced with respect to the oxidized metal oxidation film after the magnetic film and the metal oxidation film are oxidized", and alternatively, "the reduced metal oxidation film may be selectively oxidized with respect to the reduced magnetic film after the magnetic film and the metal oxidation film are reduced".

More specifically, in the technical concept of the present invention, a manufacturing method for manufacturing a magnetoresistive element including a first magnetic film, a metal oxidation film disposed at an upper side of the first magnetic film, and a second magnetic film disposed at an upper side of the metal oxidation film, includes oxidizing or reducing a magnetic film constituting the magnetoresistive element and a metal oxidation film constituting the magnetoresistive element, and the magnetic film constituting the magnetoresistive element and the metal oxidation film constituting the magnetoresistive element are oxidized or reduced, in a case where the magnetic film constituting the magnetoresistive element and the metal oxidation film constituting the magnetoresistive element are oxidized, the oxidized magnetic film constituting the magnetoresistive element or the oxidized metal oxidation film constituting the magnetoresistive element is selectively reduced, and in a case where the magnetic film constituting the magnetoresistive element and the metal oxidation film constituting the magnetoresistive element are reduced, the reduced magnetic film constituting the magnetoresistive element or the reduced metal oxidation film constituting the magnetoresistive element is selectively oxidized.

The present invention can also be said to be a manufacturing method of a magnetoresistive element in which a Gibbs energy change (ΔG) in a reaction of the oxidized magnetic film and the magnesium oxide (MgO) and the reducing gas used for the reduction processing satisfy the following four conditional expressions.

$Fe_2O_3$+reducing gas=2Fe+reaction product (ΔG<0)  (1)

$Co_3O_4$+reducing gas=3Co+reaction product (ΔG<0)  (2)

NiO+reducing gas=Ni+reaction product (ΔG<0)  (3)

MgO+reducing gas=Mg+reaction product (ΔG>0)  (4)

Further, the present invention performs, after a dry etching step for processing a magnetic film and magnesium oxide (MgO) or only the magnetic film is performed, an oxidation step for oxidizing the magnesium oxide (MgO) and the magnetic film in the magnetoresistive element by using plasma generated by using an oxygen-including gas or an oxygen-including gas and a reduction step using a reducing gas satisfying the above expressions (1) to (4), which are performed in order, so that only the oxidized magnetic film can be selectively reduced selectively with respect to the magnesium oxide (MgO), and the damage to the magnesium oxide (MgO) caused by the reduction generated during the plasma etching of the magnetoresistive element and the damage to the magnetic film caused by the oxidation generated during the plasma etching can be recovered. Therefore, a magnetoresistive element presenting preferable electrical characteristics achieving both of the reduction suppression of the magnesium oxide (MgO) and the oxidation suppression of the magnetic film on the entire surface of the wafer can be manufactured.

The present invention performs a dry etching step for processing a magnetic film and magnesium oxide (MgO) or only the magnetic film, an oxidation step for oxidizing the magnesium oxide (MgO) and the magnetic film in the magnetoresistive element by using plasma generated by using an oxygen-including gas or an oxygen-including gas, a reduction step for reducing the oxidized magnetic film in the magnetoresistive element by using the reducing gas, and a step of forming a protection film of an insulating material on a magnetoresistive element, which are performed in order in a vacuum atmosphere, so that the deterioration of the magnesium oxide (MgO) due to the moisture content in the atmosphere can be suppressed, and the protection film of the insulating material formed on the magnetoresistive element can suppress short-circuiting of the free layer and the fixed layer via the protection film.

The present invention uses a formic acid gas as the reducing gas, and the pressure force in the processing chamber when the formic acid gas is emitted is a pressure force within a range of 0.1 Pa to 22000 Pa, and the processing temperature of the wafer formed with the magnetoresistive element is set to a temperature within a range of 107° C. to 400° C., so that the deterioration of the magnesium oxide (MgO) due to the formic acid gas is suppressed, and only the oxidized magnetic film can be selectively reduced selectively with respect to the magnesium oxide (MgO).

According to the present invention, an apparatus independently provided with a first gas introduction hole for introducing an oxygen-including gas and a second gas introduction hole for introducing a formic acid-including gas performs a step of oxidizing magnesium oxide (MgO) and a magnetic film in a magnetoresistive element by using an oxygen-including gas and a step of reducing the oxidized magnetic film in the magnetoresistive element by using the formic acid-including gas, which are performed in the same vacuum container, so that an apparatus having a smaller footprint and manufacturing the magnetoresistive element presenting preferable electrical characteristics achieving both of the oxidation suppression of the magnetic film and the reduction suppression of the magnesium oxide (MgO) on the entire surface of the wafer can be provided.

What is claimed is:

1. A vacuum processing apparatus for manufacturing, in a vacuum state, a magnetoresistive element including a first magnetic film, a metal oxidation film disposed at an upper side of the first magnetic film, and a second magnetic film disposed at an upper side of the metal oxidation film, the vacuum processing apparatus comprising:
    a first processing chamber for oxidizing or reducing the magnetic film constituting the magnetoresistive element and the metal oxidation film constituting the magnetoresistive element; and
    a second processing chamber, wherein after the processing of the first processing chamber, in a case where the magnetic film constituting the magnetoresistive element and the metal oxidation film constituting the magnetoresistive element are oxidized, the oxidized magnetic film constituting the magnetoresistive element or the oxidized metal oxidation film constituting the magnetoresistive element is selectively reduced, and in a case where the magnetic film constituting the magnetoresistive element and the metal oxidation film constituting the magnetoresistive element are reduced, the reduced magnetic film constituting the magnetoresistive element or the reduced metal oxidation film constituting the magnetoresistive element is selectively oxidized, wherein
    the first processing chamber and the second processing chamber are processing chambers in which processing is performed in a vacuum state.

2. The vacuum processing apparatus according to claim 1, wherein the first processing chamber is a processing chamber in which oxidation processing is performed.

3. A vacuum processing apparatus for manufacturing, in a vacuum state, a magnetoresistive element including a first magnetic film, a metal oxidation film disposed at an upper side of the first magnetic film, and a second magnetic film disposed at an upper side of the metal oxidation film, the vacuum processing apparatus comprising a processing chamber that performs:
    a first step for oxidizing or reducing a magnetic film constituting the magnetoresistive element and a metal oxidation film constituting the magnetoresistive element; and
    a second step performed after the first step, wherein in the second step, in a case where the magnetic film constituting the magnetoresistive element and the metal oxidation film constituting the magnetoresistive element are oxidized, the oxidized magnetic film constituting the magnetoresistive element or the oxidized metal oxidation film constituting the magnetoresistive element is selectively reduced, and in a case where the magnetic film constituting the magnetoresistive element and the metal oxidation film constituting the magnetoresistive element are reduced, the reduced magnetic film constituting the magnetoresistive element or the reduced metal oxidation film constituting the magnetoresistive element is selectively oxidized, wherein
    the processing chamber is a processing chamber in which processing is performed in a vacuum state.

4. The vacuum processing apparatus according to claim 3, wherein the processing chamber is independently arranged with a first gas introduction mechanism introducing an oxidation processing gas and a second gas introduction mechanism introducing a reduction processing gas.

5. The vacuum processing apparatus according to claim 4, wherein the first gas introduction mechanism is provided with a mechanism for preventing the reduction processing gas from being mixed by passing a rare gas or a mixed gas of the rare gas and a nitrogen gas.

* * * * *